United States Patent
Matsuura et al.

(10) Patent No.: US 6,917,241 B2
(45) Date of Patent: Jul. 12, 2005

(54) AMPLIFIER CIRCUIT, TRANSMISSION DEVICE, AMPLIFICATION METHOD, AND TRANSMISSION METHOD

(75) Inventors: Toru Matsuura, Osaka (JP); Hisashi Adachi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/435,784

(22) Filed: May 12, 2003

(65) Prior Publication Data

US 2004/0036530 A1 Feb. 26, 2004

(30) Foreign Application Priority Data

May 13, 2002 (JP) ........................................ 2002-137584

(51) Int. Cl.⁷ ................................................ H03F 3/38
(52) U.S. Cl. ........................................................ 330/10
(58) Field of Search ........................... 330/10; 332/108; 341/143

(56) References Cited

U.S. PATENT DOCUMENTS

| 6,373,334 B1 * | 4/2002 | Melanson ..................... 330/10 |
| 6,518,838 B1 * | 2/2003 | Risbo ........................... 330/10 |
| 6,765,436 B1 * | 7/2004 | Melanson et al. ............ 330/10 |

FOREIGN PATENT DOCUMENTS

JP 2002-325109 11/2002

* cited by examiner

*Primary Examiner*—Steven J. Mottola
(74) *Attorney, Agent, or Firm*—RatnerPrestia

(57) ABSTRACT

An amplifier circuit has: a delta-sigma modulator which delta-sigma modulates a signal; and an amplifier which is connected to an output of the delta-sigma modulator. In the amplifier circuit, an output voltage of the delta-sigma modulator is controlled in accordance with an output power of the amplifier. When the output power of the amplifier is reduced, the output voltage of the delta-sigma modulator is lowered.

19 Claims, 21 Drawing Sheets

AMPLIFIER CIRCUIT, TRANSMISSION DEVICE, AMPLIFICATION METHOD, AND TRANSMISSION METHOD

BACKGROUND OF THE INVENTION

1. Field of the Invention

The present invention relates to a transmission circuit which exhibits high efficiency in a wide dynamic range.

2. Related Art of the Invention

A conventional transmission circuit (for example, see Japanese Patent Publication (Kokai) No. 2002-325109) will be described with reference to FIG. 19. Referring to FIG. 19, data which is generated by a data generation section 1901 is supplied to a quadrature modulator 1902 in which the data is quadrature modulated and frequency converted to a transmission frequency. An output of the quadrature modulator 1902 is supplied to a delta-sigma modulator 1903 in which the output is delta-sigma modulated. The delta-sigma modulated signal is supplied to an amplifier 1904 to be amplified. In the delta-sigma modulator 1903, a signal is converted to a binary or multilevel voltage. Therefore, the nonlinearity of the amplifier 1904 does not cause a problem, and the amplifier can be configured by a high efficiency amplifier. A band-pass filter is connected to an output of the amplifier 1904 to eliminate quantization noise, whereby a desired signal is obtained. The entire disclosure of the above literature is incorporated herein by reference in its entirety.

In the transmission circuit of FIG. 19, when the output power is constant, the characteristics of high efficiency, small distortion, and low noise can be maintained. When the output power is reduced, however, the efficiency, the distortion, or noise characteristics are impaired, so that satisfactory characteristics cannot be maintained over a wide dynamic range.

SUMMARY OF THE INVENTION

In view of the problem, it is an object of the invention to provide an amplifier or a transmission device in which, even when the output power is reduced, the distortion or noise characteristics are not impaired.

The $1^{st}$ aspect of the present invention is an amplifier circuit comprising: a converter which convert an input signal to an analog signal in which an amplitude resolution of an output is lower than an amplitude resolution of an input; and an amplifier which is connected to an output of said converter, an output voltage of said converter being controlled in accordance with an output power of said amplifier.

The $2^{nd}$ aspect of the present invention is an amplifier circuit comprising: a converter which converts a continuous signal to a discrete analog signal; and an amplifier which is connected to an output of said converter, an output voltage of said converter being controlled in accordance with an output power of said amplifier.

The $3^{rd}$ aspect of the present invention is an amplifier circuit according to the $2^{nd}$ aspect, wherein said converter is a delta-sigma modulator, and said output voltage of said converter is a value defined as a maximum value in discrete voltages output from said converter.

The $4^{th}$ aspect of the present invention is an amplifier circuit according to the $2^{nd}$ aspect, wherein said converter is a delta-sigma modulator which delta-sigma modulates a vector modulated signal, and instead of controlling said output voltage of said delta-sigma modulator in accordance with said output power of said amplifier, said output voltage of said delta-sigma modulator is controlled in accordance with a modulation system of said modulated signal.

The $5^{th}$ aspect of the present invention is an amplifier circuit according to the $3^{rd}$ or $4^{th}$ aspect, wherein an output stage inside said delta-sigma modulator has first gain-variable amplifying means, and said output voltage of said delta-sigma modulator is controlled by controlling a gain of said first gain-variable amplifying means.

The $6^{th}$ aspect of the present invention is an amplifier circuit according to the $3^{rd}$ or $4^{th}$ aspect, wherein second gain-variable amplifying means is connected between said delta-sigma modulator and said amplifier, and said output power is controlled by said second gain-variable amplifying means instead of being controlled by said output voltage of said delta-sigma modulator.

The $7^{th}$ aspect of the present invention is an amplifier circuit according to the $3^{rd}$ or $4^{th}$ aspect, wherein a power source voltage of said amplifier is controlled in accordance with said output power.

The $8^{th}$ aspect of the present invention is a transmission device wherein said transmission device comprises an amplifier circuit according to the $3^{rd}$ or $4^{th}$ aspect, and an output signal of said amplifier circuit is transmitted as a transmission signal.

The $9^{th}$ aspect of the present invention is a transmission device comprising:

a data generation section which generates a signal;

a vector modulator which modulates said signal output from said data generation section;

an amplifier circuit according to the $3^{rd}$ or $4^{th}$ aspect which amplifies a signal output from said vector modulator; and a band-pass filter which band-passes a signal output from said amplifier circuit.

The $10^{th}$ aspect of the present invention is a transmission device wherein said transmission device comprises a delta-sigma modulator which delta-sigma modulates a signal, a signal containing said delta-sigma modulated signal is used as a transmission signal, and an output voltage of said delta-sigma modulator is controlled in accordance with a level of said transmission signal.

The $11^{th}$ aspect of the present invention is a transmission device according to the $10^{th}$ aspect, wherein, when an output power of said transmission device is lowered, said output voltage of said delta-sigma modulator is controlled to be lowered.

The $12^{th}$ aspect of the present invention is a transmission device wherein said transmission device comprises a delta-sigma modulator which delta-sigma modulates a modulated signal, a signal containing said delta-sigma modulated signal is used as a transmission signal, and an output voltage of said delta-sigma modulator is controlled in accordance with a modulation system of said transmission signal.

The $13^{th}$ aspect of the present invention is a transmission device according to the $10^{th}$ or $12^{th}$ aspect, wherein an output stage inside said delta-sigma modulator has first gain-variable amplifying means, and said output voltage of said delta sigma modulator is controlled by controlling a gain of said first gain-variable amplifying means.

The 14th aspect of the present invention is a transmission device according to the 10th or 12th aspect, wherein second gain-variable amplifying means is connected to an output of said delta-sigma modulator, and the level of said transmission signal is controlled by controlling a gain of said second gain-variable amplifying means.

The 15th aspect of the present invention is a transmission device according to the 10th or 12th aspect, wherein an amplitude component of a signal is delta-sigma modulated, a phase component of said signal is angle modulated, and a signal which is obtained by multiplying said delta-sigma modulated signal with said angle modulated signal is used as said transmission signal.

The 16th aspect of the present invention is a transmission device according to the 15th aspect, wherein said transmission device comprises:

a data generation section which outputs an amplitude signal and a phase signal;

a delta-sigma modulator in which an input is connected to an amplitude signal output of said data generation section, and which delta sigma modulates an input signal;

an angle modulator in which an input is connected to a phase signal output of said data generation section, and which angle modulates an input signal;

a multiplier in which an input is connected to an output of said delta-sigma modulator and an output of said angle modulator, and which multiplies input signals with each other; and a band-pass filter which is connected to an output of said multiplier, and which band-passes an input signal.

The 17th aspect of the present invention is a transmission device wherein said transmission device comprises a delta-sigma modulator which delta-sigma modulates a signal, when a level of a transmission signal is larger than a predetermined value, an amplitude component of a signal is delta-sigma modulated, and a phase component of said signal is angle modulated, a signal which is obtained by multiplying said delta-sigma modulated signal with said angle modulated signal is used as a transmission signal, and when a level of said transmission signal is smaller than said predetermined value, a signal is vector modulated, and said vector modulated signal is amplified to be used as said transmission signal.

The 18th aspect of the present invention is a transmission device according to the 17th aspect, wherein said transmission device comprises:

a data generation section which outputs an amplitude signal, a phase signal, and a quadrature signal;

a delta-sigma modulator in which an input is connected to an amplitude signal output of said data generation section, and which delta-sigma modulates an input signal;

an angle modulator in which an input is connected to a phase signal output of said data generation section, and which angle modulates an input signal;

a vector modulation section in which an input is connected to a quadrature signal output of said data generation section, and which vector modulates an input signal;

a DC power source which supplies a DC component;

a first switch in which an output of said delta-sigma modulator and an output of said DC power source are respectively connected to inputs to be selected, and which selectively outputs one of an output signal of said delta-sigma modulator and an output signal of said DC power source;

a second switch in which an output of said angle modulator and an output of said vector modulation section are respectively connected to inputs to be selected, and which selectively outputs one of an output signal of said angle modulator and an output signal of said vector modulation section;

a multiplier in which an input is connected to an output of said first switch and an output of said second switch, and which multiplies two input signals with each other, and which outputs a signal of a result of the multiplication; and a band-pass filter which is connected to an output of said multiplier, and which band-passes said signal output from said multiplier, when a level of a transmission signal is larger than a predetermined value, said first switch selects said output of said delta-sigma modulator, and said second switch selects said output of said angle modulator, and when said level of said transmission signal is smaller than said predetermined value, said first switch selects said output of said DC power source, and said second switch selects said output of said vector modulation section.

The 19th aspect of the present invention is a transmission device wherein said transmission device comprises a delta-sigma modulator which delta-sigma modulates a signal, when linear modulation is selected as a modulation system of a transmission signal, an amplitude component of a signal is delta-sigma modulated, and a phase component of said signal is angle modulated, a signal which is obtained by multiplying said delta-sigma modulated signal with said angle modulated signal is used as a transmission signal, and when nonlinear modulation is selected as the modulation system of said transmission signal, said angle modulated signal is amplified to be used as said transmission signal.

The 20th aspect of the present invention is a transmission device according to the 17th aspect, wherein said vector modulated signal is amplified by multiplication with a DC component which is a signal obtained by low-passing a signal output from said delta-sigma modulator.

The 21st aspect of the present invention is a transmission device according to any one of the 17th to the 20th aspect, wherein an output voltage of said delta-sigma modulator is controlled in accordance with said level of said transmission signal.

The 22nd aspect of the present invention is an amplification method wherein a signal is delta-sigma modulated by a delta-sigma modulator, said delta-sigma modulated signal is amplified, and an output voltage of said delta-sigma modulator is controlled in accordance with a power of said amplified signal.

The 23rd aspect of the present invention is a transmission method wherein a continuous signal is converted to a discrete analog signal by a converter, a signal containing said converted signal is used as a transmission signal, and an output voltage of said converter is controlled in accordance with a level of said transmission signal.

Figure 1:
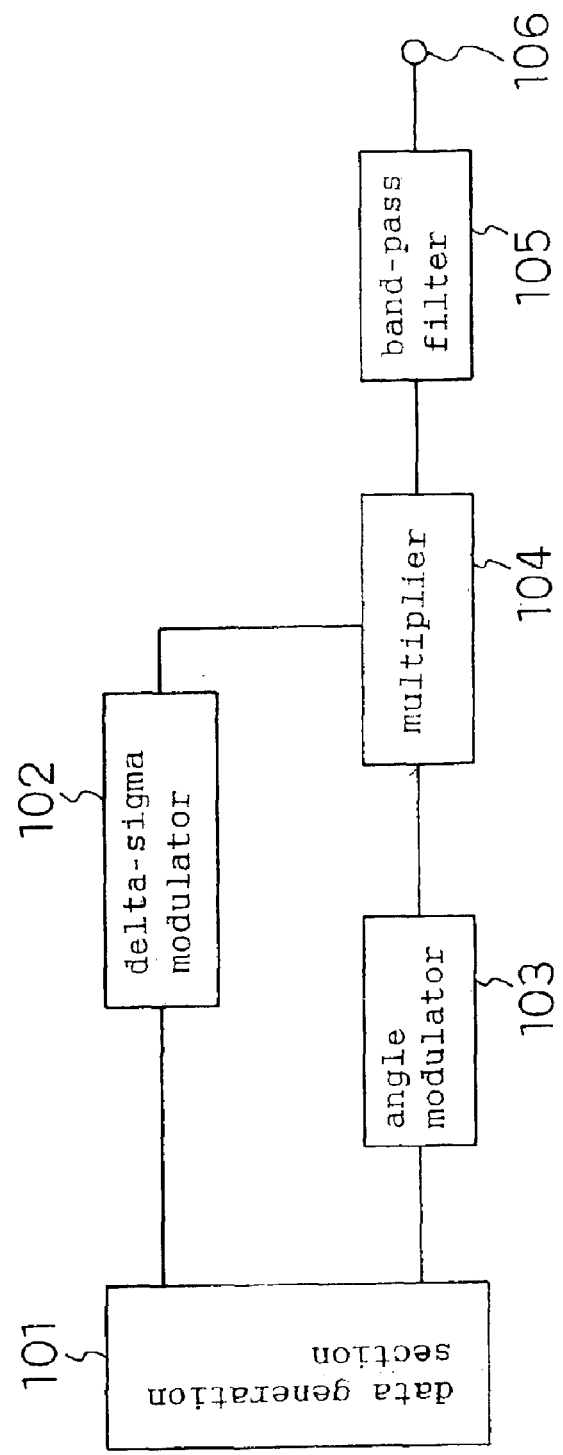
FIG. 1 is a block diagram illustrating Embodiment 2 of the invention.

DESCRIPTION OF REFERENCE NUMERALS 101 data generation section
102 delta-sigma modulator
103 angle modulator
104 multiplier
105 band-pass filter
106 output terminal
201 data generation section
202 delta-sigma modulator
203 angle modulator
204 multiplier
205 band-pass filter
206 output terminal
207 gain-variable amplifier
301 modulated signal generator
302 delta-sigma modulator
303 continuous wave signal source
304 multiplier
305 band pass filter
306 output terminal
401 data generation section
402 delta-sigma modulator
403 angle modulator
404 multiplier
405 band-pass filter
406 output terminal
407 DC power source
408 vector modulation section
409, 410 switch
501 data generation section
502 delta-sigma modulator
503 angle modulator
504 multiplier
505 band-pass filter
506 output terminal
507 DC power source
508 switch
601 data generation section
602 delta-sigma modulator
603 angle modulator
604 multiplier
605 band-pass filter
606 output terminal
701 data generation section
702 delta-sigma modulator
703 angle modulator
704 multiplier
705 band pass filter
706 output terminal
707 vector modulation section
708 switch
709 low-pass filter
801 data generation section
802 vector modulator
803 delta-sigma modulator
804 amplifier
805 band-pass filter
806 output terminal
1501 data generation section
1502, 1503 delta-sigma modulator
1504 signal source
1505, 1506 phase shifter
1507, 1508 multiplier
1509, 1510 band-pass filter
1511 combiner
1512 output terminal
1701 power source terminal
1702, 1703 input terminal
1704, 1705 transformer
1706, 1707, 1708, 1709 transistor
1710, 1711, 1712, 1713 diode
1714, 1715 output terminal
1801 input terminal
1802, 1804, 1806, 1808 subtractor
1803, 1805, 1807, 1809 integrator
1810 quantizer
1811, 1812, 1813, 1814 amplifier
1815 output terminal
1901 data generation section
1902 modulator
1903 delta-sigma modulator
1904 amplifier
1905 amplifier
1906 output terminal

PREFERRED EMBODIMENTS OF THE INVENTION (Embodiment 1)

Hereinafter, Embodiment 1 of the invention will be described with reference to FIG. 8. In a transmission device (transmitter) using an amplifier circuit shown in FIG. 8, a signal which is generated by a data generation section 801 is modulated in a vector modulator 802 to a signal which is equal in frequency to a transmission signal. The signal output from the vector modulator 802 is converted to a binary or multilevel voltage by a delta-sigma modulator 803, and then supplied to an amplifier 804 to be amplified. An output of the amplifier 804 contains quantization noise in addition to a desired signal. Therefore, the quantization noise is eliminated by a band-pass filter 805.

On the other hand, in a present mobile communication system, the transmission power of a mobile terminal is controlled in accordance with the distance between the mobile terminal and a base station. Specifically, the transmission power of the terminal is controlled in the following manner. When the distance between the mobile terminal and a base station is short (when the reception power in the terminal or the base station is large), the transmission power of the terminal is reduced in accordance with the level of the reception power in the terminal or the base station (for example, in accordance with a difference between the reception power in the terminal or the base station and a predetermined reception power). When the distance between the mobile terminal and a base station is long (when the reception power in the terminal or the base station is small), the transmission power of the terminal is increased in accordance with the level of the reception power in the terminal or the base station (for example, in accordance with the difference between the reception power in the terminal or the base station and the predetermined reception power).

Figure 9:
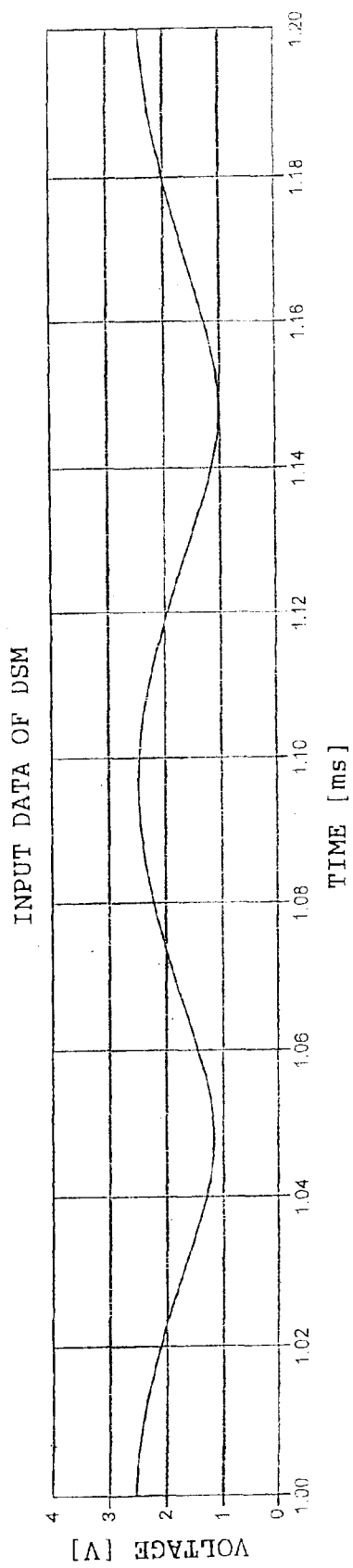
FIG. 9 is a view showing input and output signals of a delta-sigma modulator.
Figure 9:
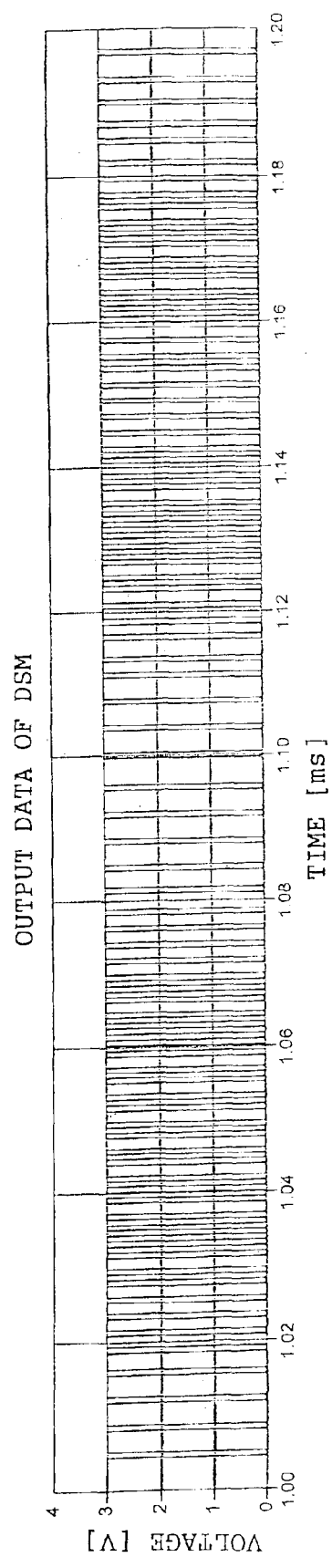
Figure 10:
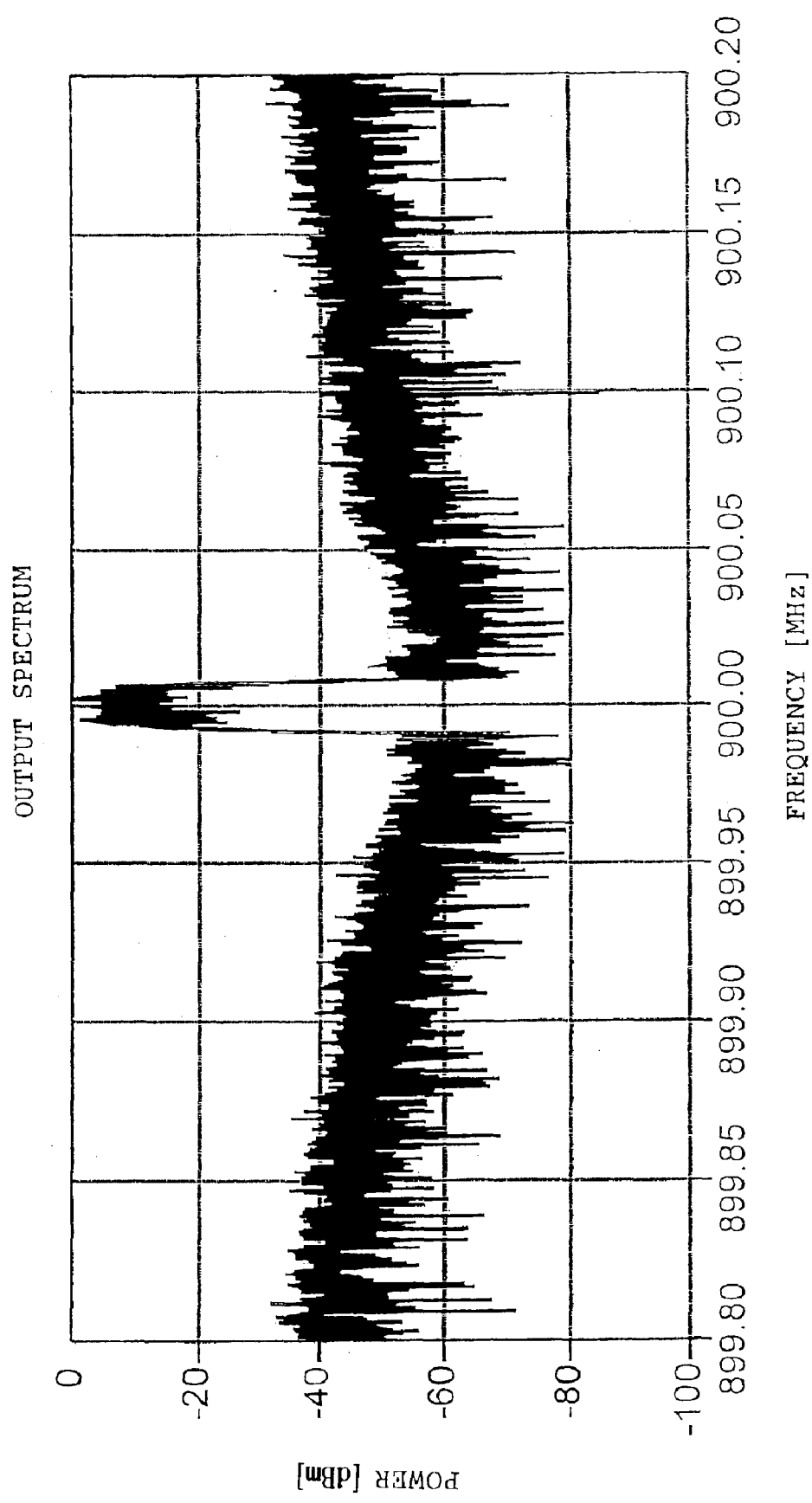
FIG. 10 is a view showing an output spectrum of the delta-sigma modulator.
Figure 11A:
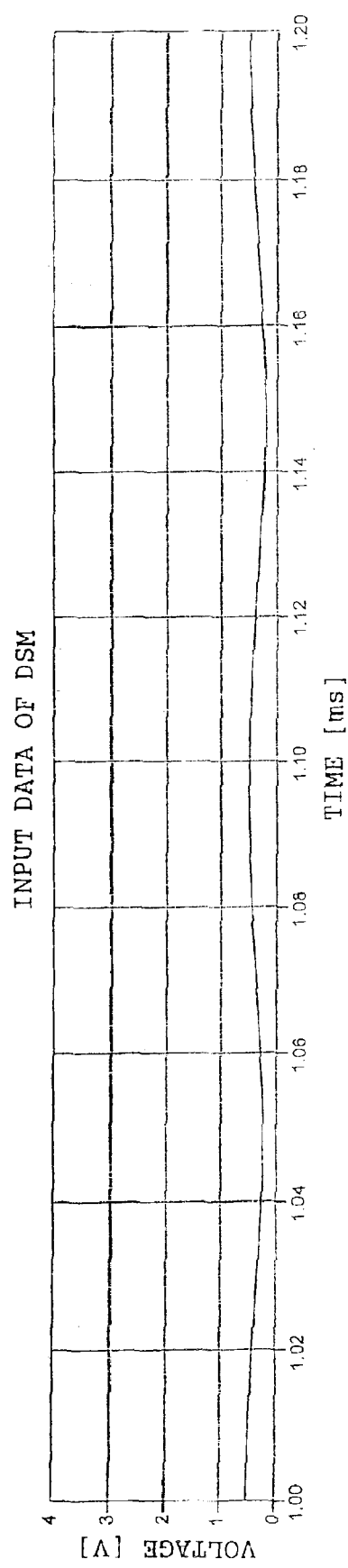
FIG. 11 is a view showing input and output signals of a delta-sigma modulator.
Figure 11B:
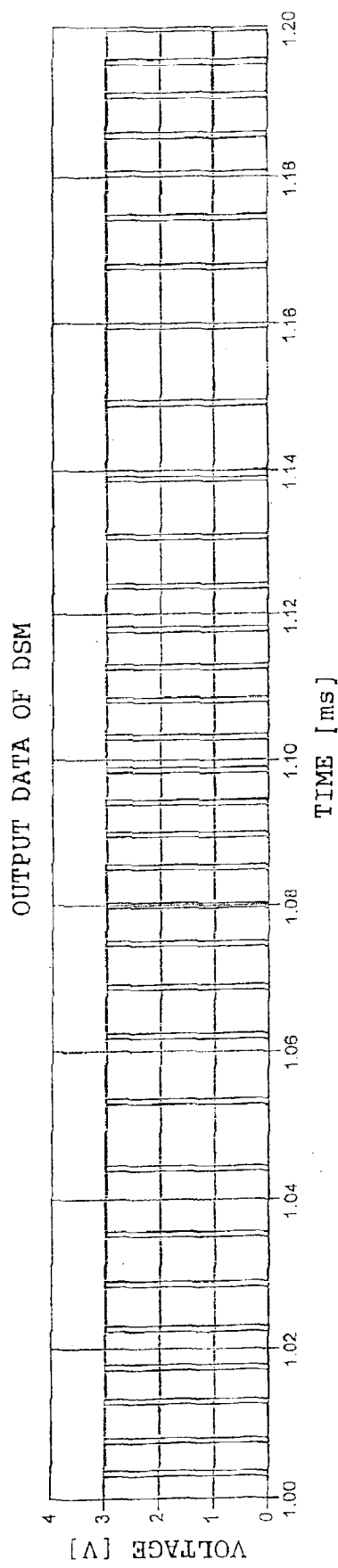
Figure 12:
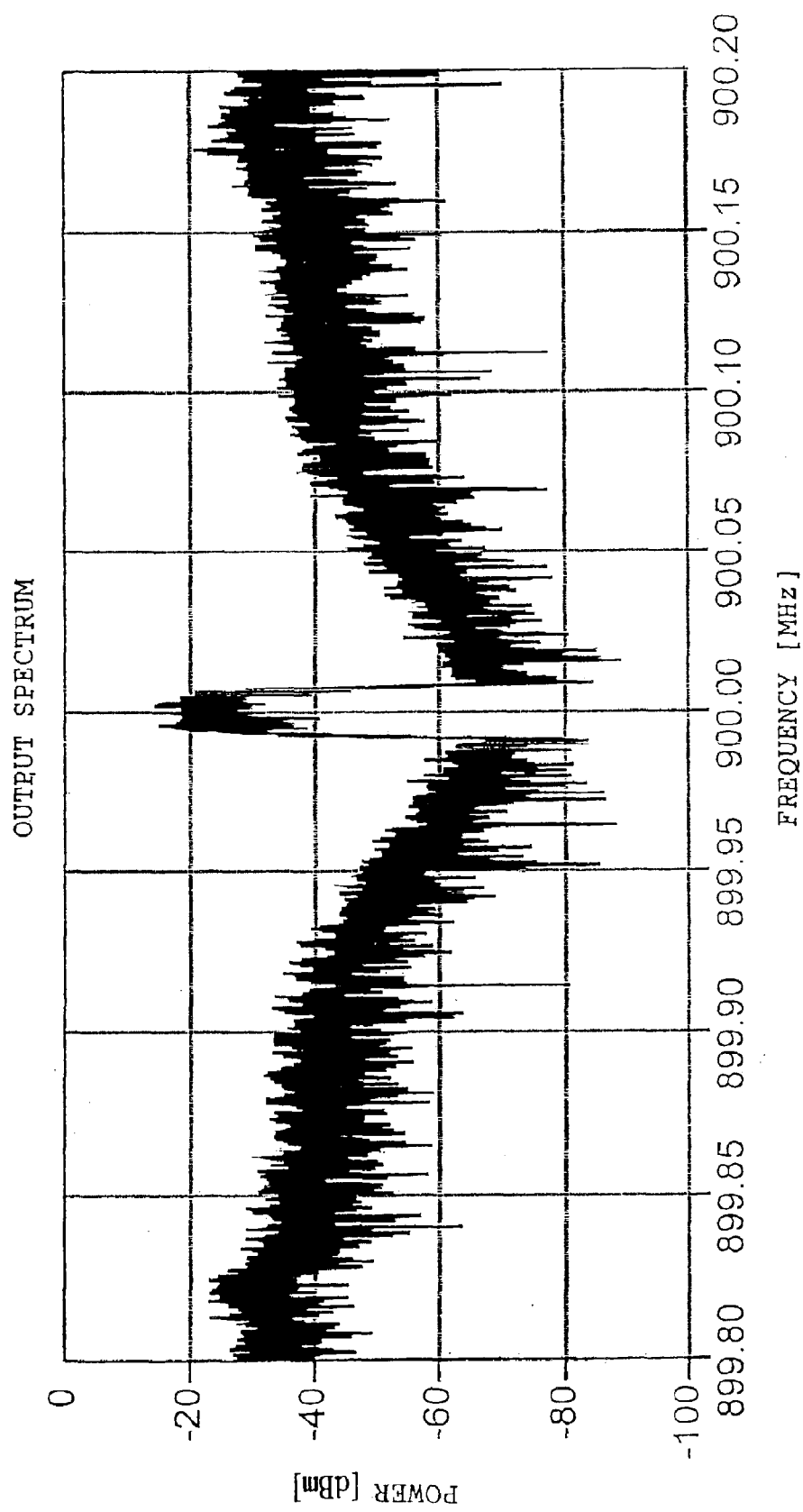
FIG. 12 is a view showing an output spectrum of the delta-sigma modulator.
Figure 13A:
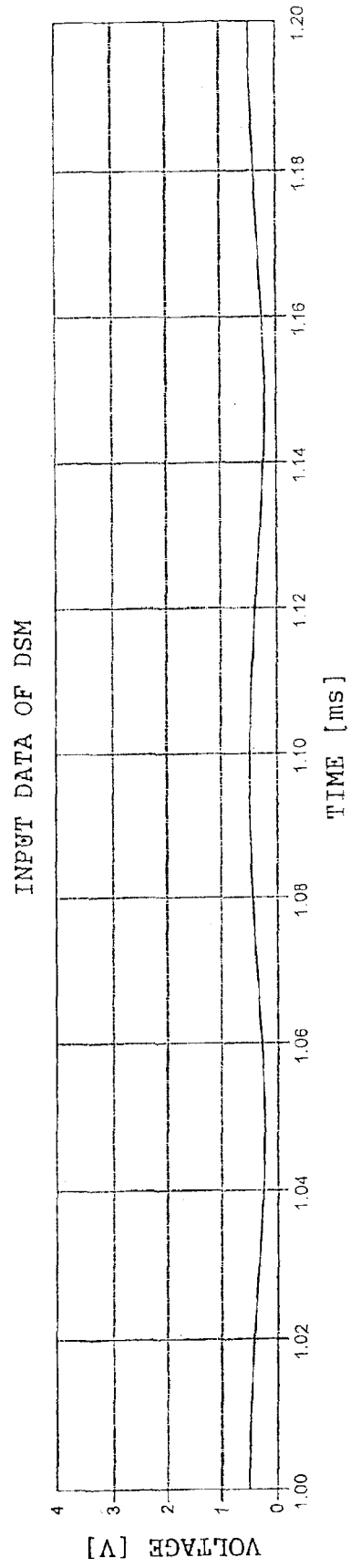
FIG. 13 is a view showing input and output signals of a delta-sigma modulator.
Figure 13B:
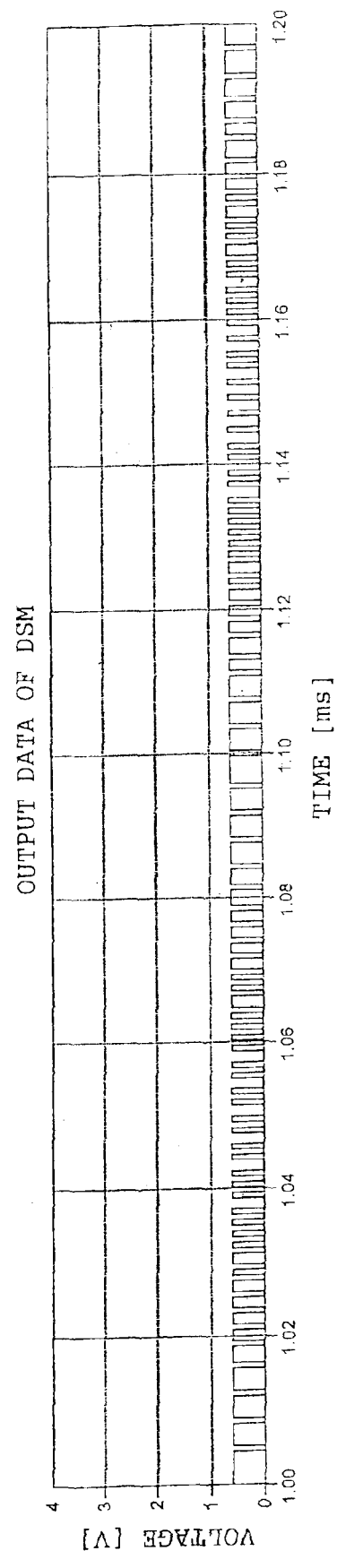
Figure 14:
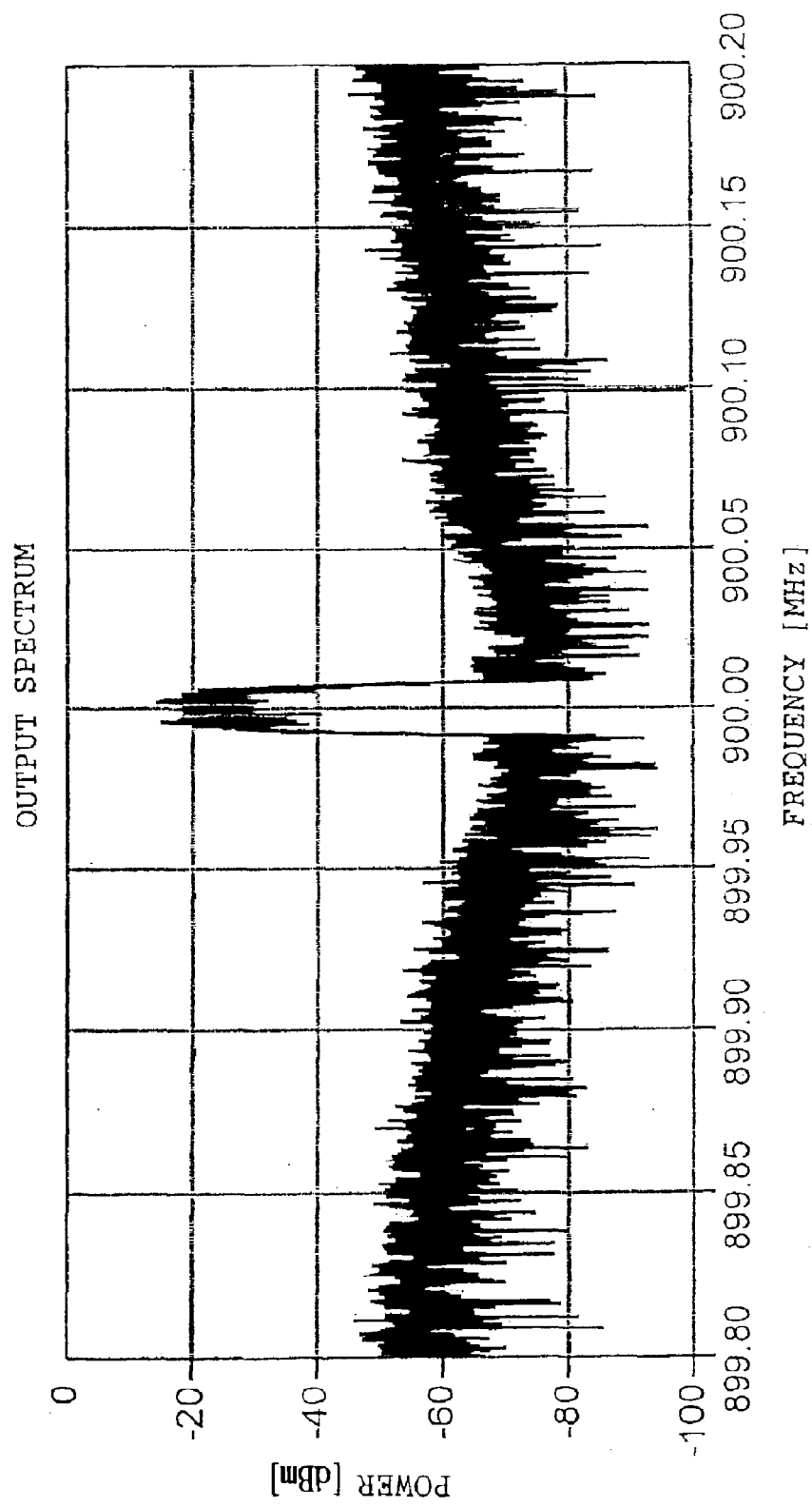
FIG. 14 is a view showing an output spectrum of the delta-sigma modulator.

In the invention, the output voltage of the delta-sigma modulator 803 is changed in accordance with the level of the output power from an output terminal 806. Specifically, for example, in the output stage inside the delta-sigma modulator 803, the gain of a gain-variable amplifier circuit 807 which is an example of the first gain-variable amplifying means in the invention is changed. Hereinafter, the case where a 1st order single-bit delta-sigma modulator is used will be described as an example. For comparison, the case where the voltage of the delta-sigma modulator 803 is not changed will be described. FIG. 9 shows input and output signals of the delta-sigma modulator 803 in the case of a large output power. FIG. 10 shows the spectrum. FIGS. 11(a) and 11(b) show input and output signals of the delta-sigma modulator 803 in the case where the output signal is low in level. FIG. 12 shows the spectrum in this case. It will be seen that quantization noise is large with respect to the signal. By contrast, FIGS. 13(a), 13(b), and 14 show results in the case where, when the transmission power is small, the output voltage of the delta-sigma modulator 803 is lowered. As compared with the results of FIGS. 11 and 12, it will be seen that quantization noise is reduced with respect to the desired signal.

In the above description, it is assumed that the output signal of the delta-sigma modulator is an ideal rectangular wave. In practice, finite rising and falling time exist. Therefore, losses are produced and the efficiency is lowered as compared with the ideal state. In the case where the output voltage of the delta-sigma modulator 803 is not controlled, the losses exert a large influence when the output power is small, there by causing the efficiency to be greatly lowered. When the output power is small, therefore, the output voltage of the delta-sigma modulator 803 is lowered, so that losses can be prevented from being increased.

In the above description, the output voltage of the delta-sigma modulator 803 is controlled in accordance with the level of the desired output power of the transmission circuit.

Alternatively, the output voltage of the delta-sigma modulator 803 may be controlled in accordance with the modulation system, whereby the same effects can be attained. Namely, even at the same average output power, the output voltage of the delta-sigma modulator 803 is lowered in the case of a signal of a small peak factor (a signal of a small envelope variation).

The amplifier 804 is connected to the output of the delta-sigma modulator 803. When the average output power of the delta-sigma modulator is small, the amount of back-off from the saturation output power of the amplifier is increased, and hence the efficiency of the amplifier is lowered. When the output voltage of the delta-sigma modulator is lowered, therefore, characteristics of high efficiency can be maintained by lowering the power source voltage which is supplied to a collector or drain of the amplifier.

Figure 17:
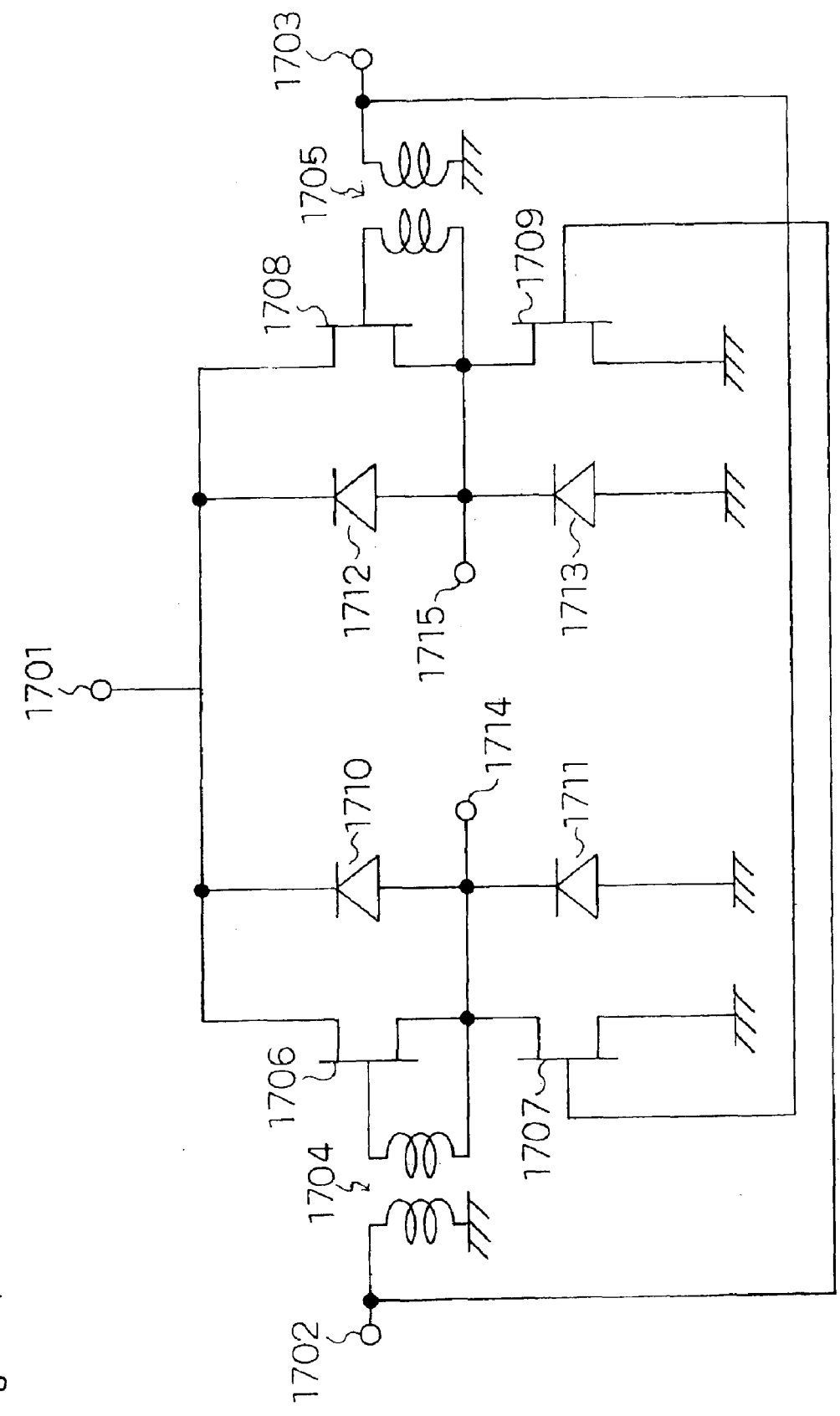
FIG. 17 is a diagram showing an example of the configuration of a Class S amplifier.

When the amplifier 804 performs Class S operation, it is possible to obtain characteristics of high efficiency. FIG. 17 shows an example which is a circuit disclosed in "High Efficiency RF Power Amplifiers Using Bandpass Delta-Sigma Modulators," materials in a seminar by Agilent Technologies, Inc. Referring to FIG. 17, signals which are supplied respectively to input terminals 1702 and 1703 are amplified and then output from output terminals 1714 and 1715. The input signals have either of two values of VL and VH. Different voltages are applied to the input terminals 1702 and 1703, respectively. When the voltage of the input terminal 1702 is VL, that of the input terminal 1703 is VH, and, when the voltage of the input terminal 1702 is VH, that of the input terminal 1703 is VL. Therefore, balanced signals are output from the output terminals 1714 and 1715. According to the configuration, transistors perform a switching-operation, and hence high-efficiency amplification is enabled.

Figure 18:
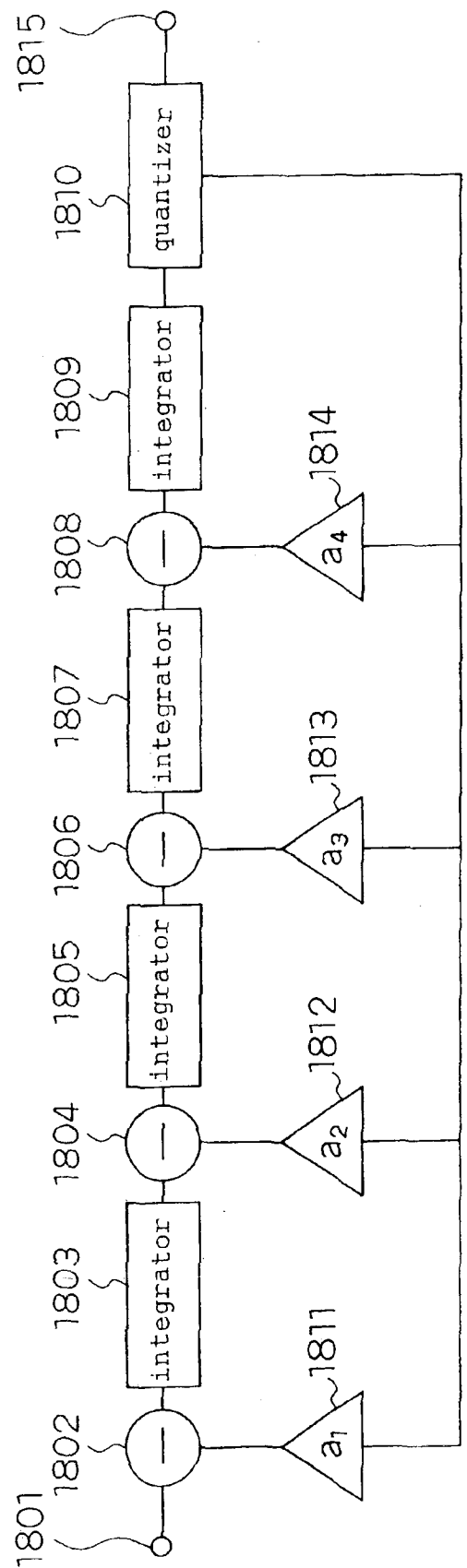
FIG. 18 is a diagram showing an example of the configuration of a delta-sigma modulator.
Figure 19:
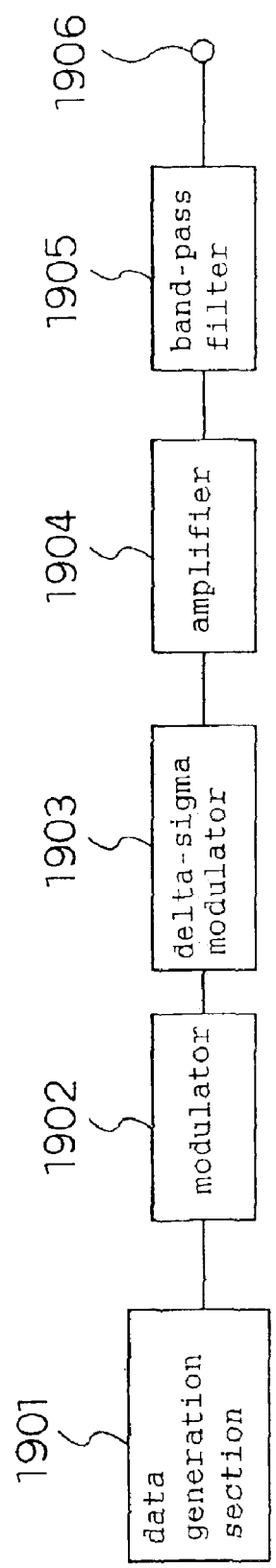
FIG. 19 is a block diagram showing the configuration of a conventional amplifier circuit.

As an example of a delta-sigma modulator, FIG. 18 shows a 5th-order delta-sigma modulator. When gains a1, a2, a3, and a4 of amplifiers 1811 to 1814 are selected to have adequate values, stable delta-sigma modulation is enabled. One of subtractors, for example, a subtractor 1802 operates so as to subtract an output of the amplifier 1811 from an input to an input terminal 1801, and supply the subtraction result to an integrator 1803. A subtractor 1804 operates so as to subtract an output of the amplifier 1812 from an output of the integrator 1803, and supply the subtraction result to an integrator 1805. The other subtractors operate in the same manner.

In the above, the configuration in which the output voltage of the delta-sigma modulator 803 is controlled in accordance with the level of the output power from an output terminal 806 (the level of the transmission signal) has been described. However, it may be contemplated that, even at the same output power, the output voltage of the delta-sigma modulator 803 is controlled in accordance with the modulation system. In recent years, actually, a wireless communication device which is compatible with a plurality of modulation systems has been developed. For example, GMSK is used in the GSM system which is called the second generation, and HPSK is used in the W-CDMA system which is called the third generation. In the fourth generation, OFDM is expected to be used. In GMSK, the signal envelope is not varied. In HPSK, there is a peak factor (crest factor) of about 3 to 4 dB, and, in OFDM, the peak factor is equal to or larger than 10 dB. Even at the same average output power, when the degree of the peak factor is changed, a signal can be effectively prevented from being impaired, by controlling the output voltage of the delta-sigma modulator 803. The reason of this is as follows. When the output voltage of the delta-sigma modulator 803 is excessively low, the peak is suppressed and a signal is distorted. When the output voltage is excessively high, the noise level is raised. For example, when output power of a multi-mode transmitter is fixed, the peak factor of an OFDM modulated wave is larger than that of an HPSK modulated wave. When an OFDM modulated wave is to be amplified, therefore, the output voltage of the delta-sigma modulator 803 can be set to have a large difference between the upper and lower limit values. In a system where the required transmission power is small, the amplifier 804 may be omitted.

(Embodiment 2)

Figure 16:
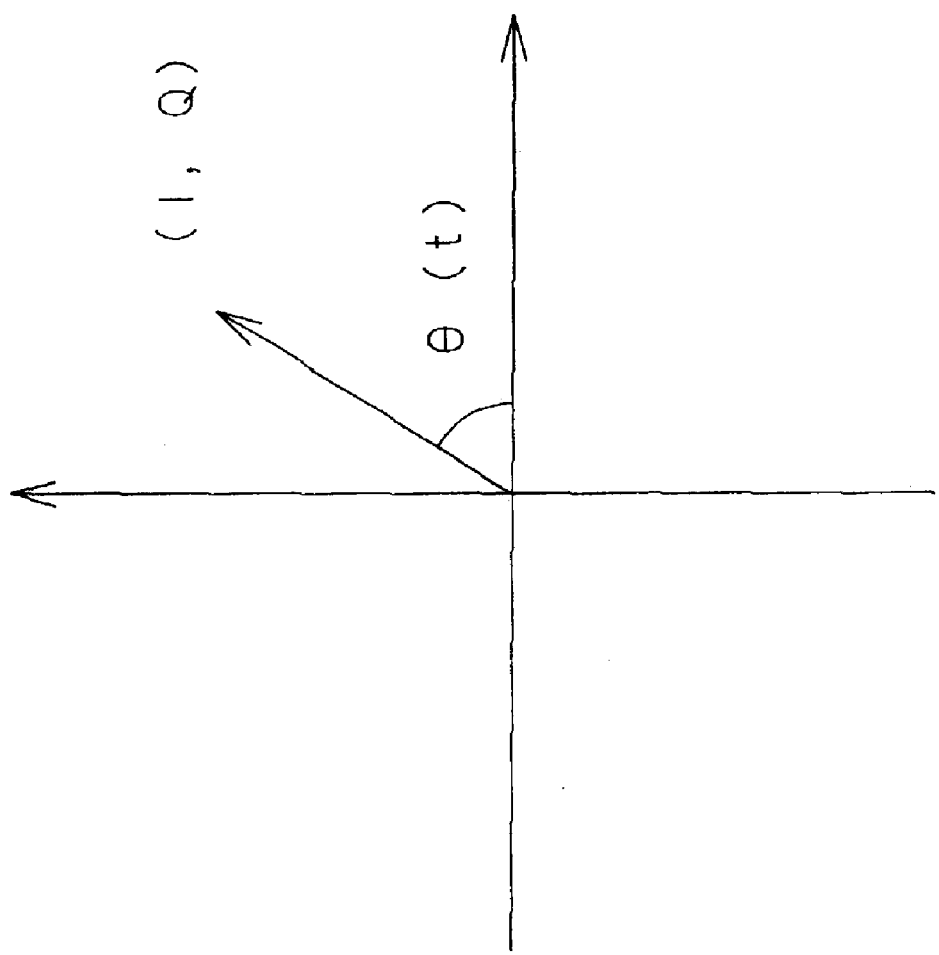
FIG. 16 is a view illustrating amplitude data and phase data.

Hereinafter, Embodiment 2 of the invention will be described with reference to FIG. 1. Referring to FIG. 1, amplitude data (an amplitude signal) and phase data (a phase signal) of a baseband signal are output from two output terminals of a data generation section 101. When two quadrature data are indicated respectively by I and Q, $(I^2+Q^2)^{1/2}$ is output as the amplitude data, and the angle formed by I and Q vectors, i.e., arctan (Q/I) is output as the phase data. The amplitude data is delta-sigma modulated (i.e. The amplitude data is quantized by delta-sigma modulation) by a delta-sigma modulator 102. An angle modulated signal is generated by an angle modulator 103 with using the phase data. When the center frequency of the output signal of the transmission circuit is indicated by $f_0$, and the angular frequency is indicated by $\omega_0$ $(=2\pi f_0)$, an output of the angle modulator 103 is:

$$A\cos(\omega_0 + \theta(t)) \qquad [\text{Ex. 1}]$$

where A is a constant, and θ(t) is an angle formed by vector (I, Q) as shown in FIG. 16 and indicated by:

$$\theta(t) = \arctan(Q/I). \qquad [\text{Ex. 2}]$$

Figure 20:
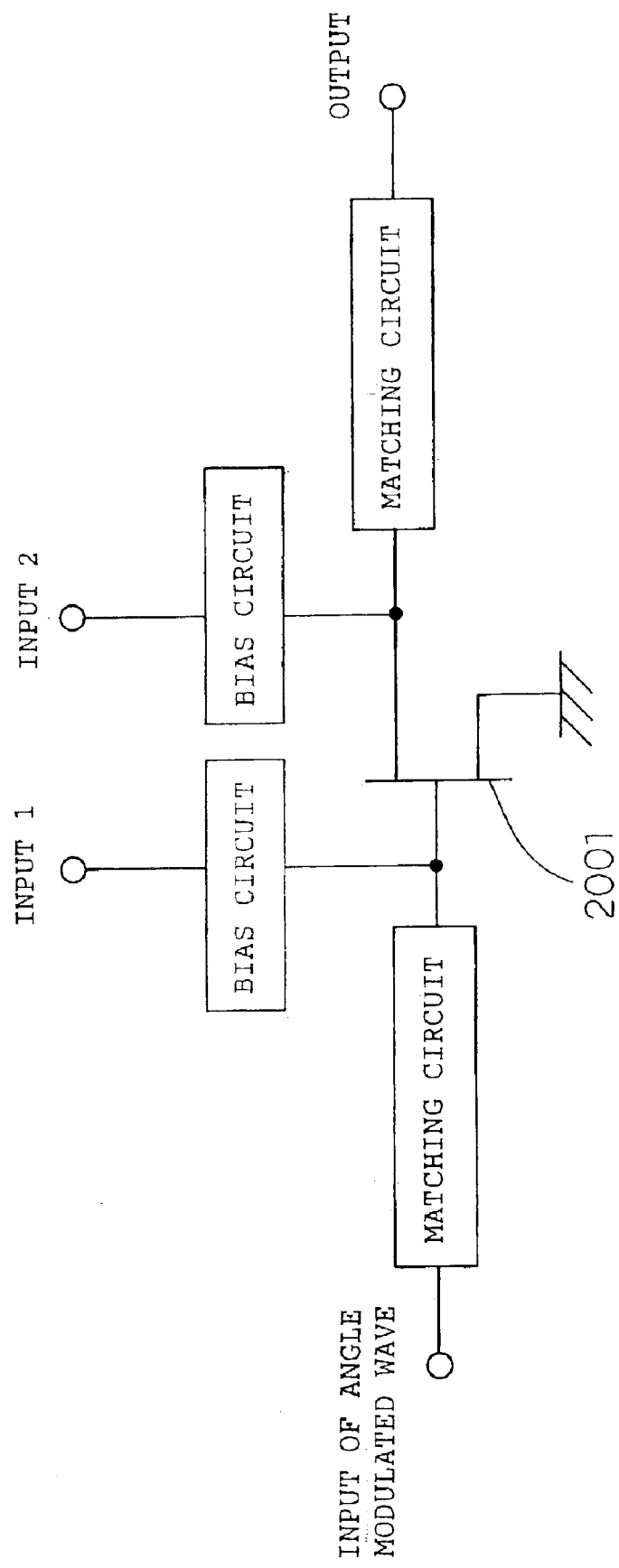
FIG. 20 is a diagram showing an example of the configuration of a multiplier which is used in the amplifier circuit of the invention.

Then, an output of the delta-sigma modulator 102 and the output of the angle modulator 103 are supplied to a multiplier (a mixer) 104 to be polar modulated. Namely, a signal which is obtained by polar modulating the delta-sigma modulated signal and the angle modulated signal is used as the transmission signal. An output of the multiplier 104 contains quantization noise. Therefore, quantization noise is eliminated by a band-pass filter 105, thereby obtaining a desired signal. The multiplier may be configured in the following manner. In order to attain amplification of a signal, for example, the output of the angle modulator 103 is supplied to the base or gate of a transistor 2001, and the output of the delta-sigma modulator is supplied to the collector or drain of the transistor 2001. FIG. 20 shows an example of such a circuit. In the circuit shown in FIG. 20, a power source is connected to one of inputs 1 and 2, and the delta-sigma modulated signal is supplied to the other input, so that both the multiplication effect and the amplification effect on the angle modulated wave and the amplitude data (delta-sigma modulated wave) can be simultaneously attained.

Figure 2:
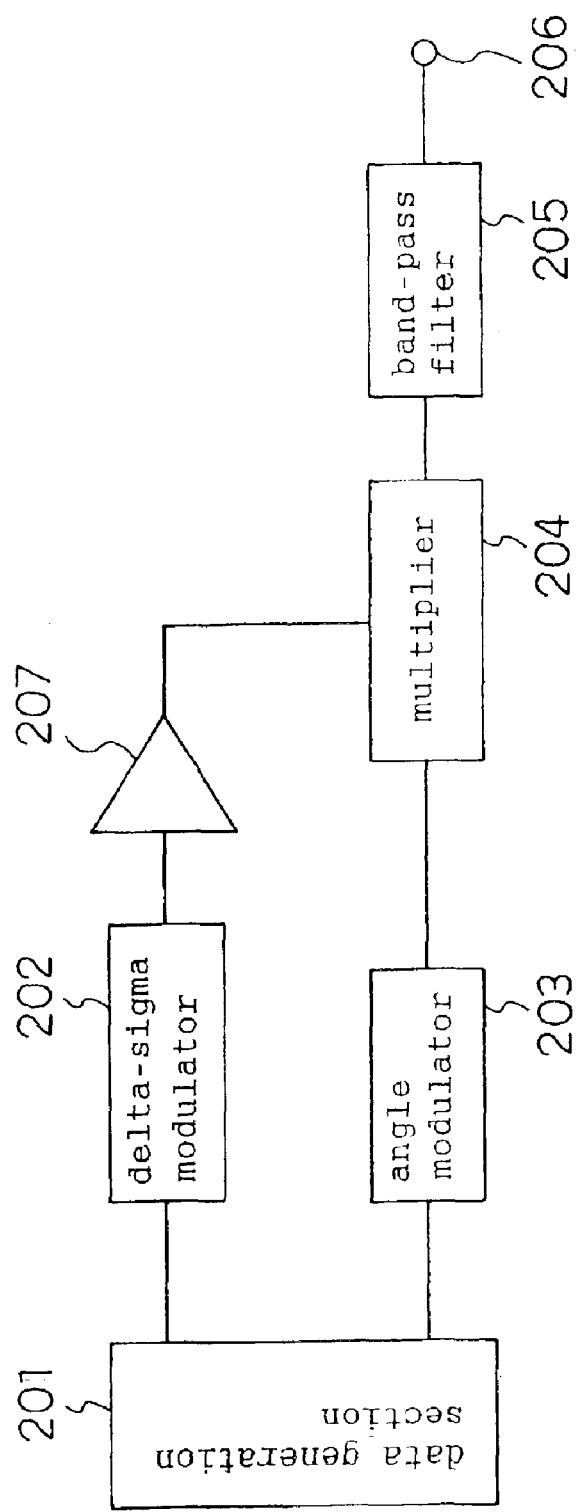
FIG. 2 is a block diagram illustrating Embodiment 2 of the invention.

In this configuration, the level of the output power from an output terminal 106 may be controlled by either of a method in which the input power of the delta-sigma modulator 102 is controlled, and that in which the output power of the angle modulator 103 is controlled. In the case where the input power of the delta-sigma modulator 102 is controlled, when the required output power from the output terminal 106 is small, the noise level of the output signal of the delta-sigma modulator 102 is high in the same manner as Embodiment 1., so that the distortion and noise characteristics of the transmission circuit are impaired. When the output power from the output terminal 106 is small, therefore, the characteristics can be prevented from being impaired, by lowering the output voltage of the delta-sigma modulator 102. Alternatively, instead of that an output voltage of a delta-sigma modulator 202 is controlled, as shown in FIG. 2, the output voltage of the delta-sigma modulator 202 may not be controlled, and a gain control may be performed by connecting a gain-variable amplifier 207 which is an example of the second gain-variable amplifying means in the invention to the output of the delta-sigma modulator 202, or a gain control may be performed in accordance with the modulation system. (This is applicable also to Embodiment 1. In this case, the gain-variable amplifier 207 is connected between the delta-sigma modulator 803 and the amplifier 804.)

By contrast, in the case where the level of the output power from the output terminal 106 is controlled by controlling the output power of the angle modulator 103, it is not necessary to control the output voltage of the delta-sigma modulator 102.

In the above description, the input signal of the delta-sigma modulator 102 is $(I^2+Q^2)^{1/2}$, and the center frequency of the output signal of the angle modulator is identical with that of the output signal of the transmission circuit. Alternatively, the following configuration may be employed. The input signal of the delta-sigma modulator 102 is:

$$(I^2+Q^2)^{1/2} \cdot \cos \omega_{IF} \cdot t, \qquad [\text{Ex. 3}]$$

and the output of the angle modulator 103 is:

$$A\cos((\omega_0 - \omega_{IF})t + \theta(t)), \qquad [\text{Ex. 4}]$$

or $$A\cos((\omega_0 + \omega_{IF})t + \theta(t)). \qquad [\text{Ex. 5}]$$

In the above expressions, the intermediate frequency is $f_{IF}$, and the angular frequency is $\omega^{IF}$ $(\omega_{IF}=2\pi f_{IF})$.

The case where an amplifier is connected to the output of the multiplier 104 will be considered. When the output voltage of the delta-sigma modulator 102 is lowered, or when the output power of the angle modulator 103 is reduced, the amplifier operates at a point where the amount of back-off from the saturation output power is large, and hence the efficiency is lowered. Therefore, characteristics of high efficiency can be maintained by lowering the power source voltage which is applied to a collector or drain of the amplifier.

(Embodiment 3)

Figure 3:
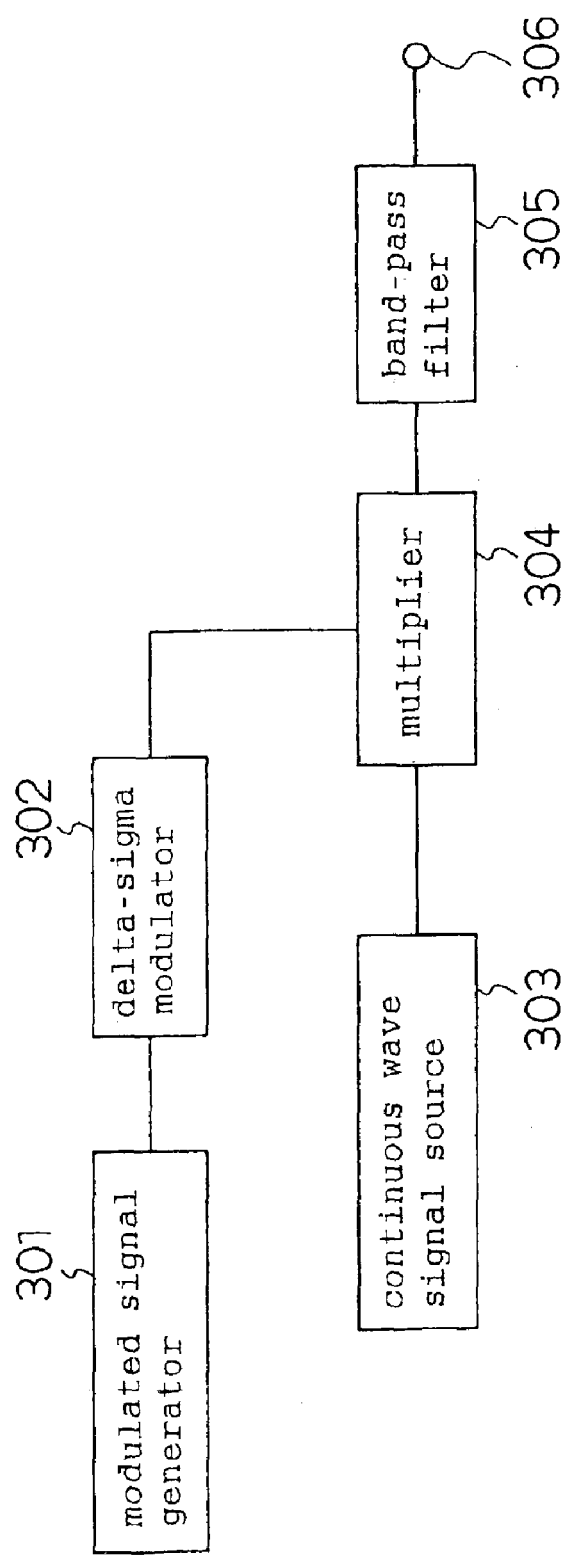
FIG. 3 is a block diagram illustrating Embodiment 3 of the invention.

Embodiment 3 of the invention will be described with reference to FIG. 3. Referring to FIG. 3, a modulated signal generator 301 generates the following modulated signal:

$$I\cos \omega_{IF}t - Q\sin \omega_{IF}t. \qquad [\text{Ex. 6}]$$

An output of the modulated signal generator 301 is delta-sigma modulated by a delta-sigma modulator 302, and then supplied to a multiplier 304. A continuous wave signal source 303 outputs a signal which is indicated by $A\cos\omega_{LO}t$, and the signal is supplied to another input of the multiplier 304. In this case, there is the following relationship:

$$\omega_0 = \omega_{LO} \pm \omega_{IF}. \qquad [\text{Ex. 7}]$$

An output of the multiplier 304 contains an undesired signal (an image signal) caused by the multiplier 304 and quantization noise. Therefore, quantization noise is eliminated by a band-pass filter 305, thereby obtaining a desired signal.

In this configuration, the level of the output power from an output terminal 306 may be controlled by either of a method in which the output power from the delta-sigma modulator 302 is controlled, and that in which the output power of the continuous wave signal source 303 is controlled. In the case where the output power from the delta-sigma modulator 302 is controlled, when the required output power from the output terminal 306 is small, the noise level of the output signal of the delta-sigma modulator 302 is high in the same manner as Embodiments 1 and 2, so that the distortion and noise characteristics of the transmission circuit are impaired. When the output power from the output terminal 306 is small, therefore, the characteristics can be prevented from being impaired, by lowering the output voltage of the delta-sigma modulator 302 as described in Embodiment 1. Here, the output voltage does not represent an average value output from the delta-sigma modulator 302 but a maximum value in discrete voltages output from the delta-sigma modulator 302. By contrast, in the case where the output power of the continuous wave signal source 303 is controlled, it is not necessary to control the output voltage of the delta-sigma modulator 302. Alternatively, instead of that the output voltage of the delta-sigma modulator 302 is controlled, the output voltage of the delta-sigma modulator 302 may not be controlled, and a gain control may be performed by connecting the gain-variable amplifier 207 to the output of the delta-sigma modulator 302.

In the case where the amplifier 804 is connected to the output of the multiplier 304, when the output voltage of the delta-sigma modulator 302 is lowered, or when the output power of the continuous wave signal source 303 is reduced, characteristics of high efficiency can be maintained by lowering the power source voltage which is supplied to a collector or drain of the amplifier.

(Embodiment 4)

Figure 15:
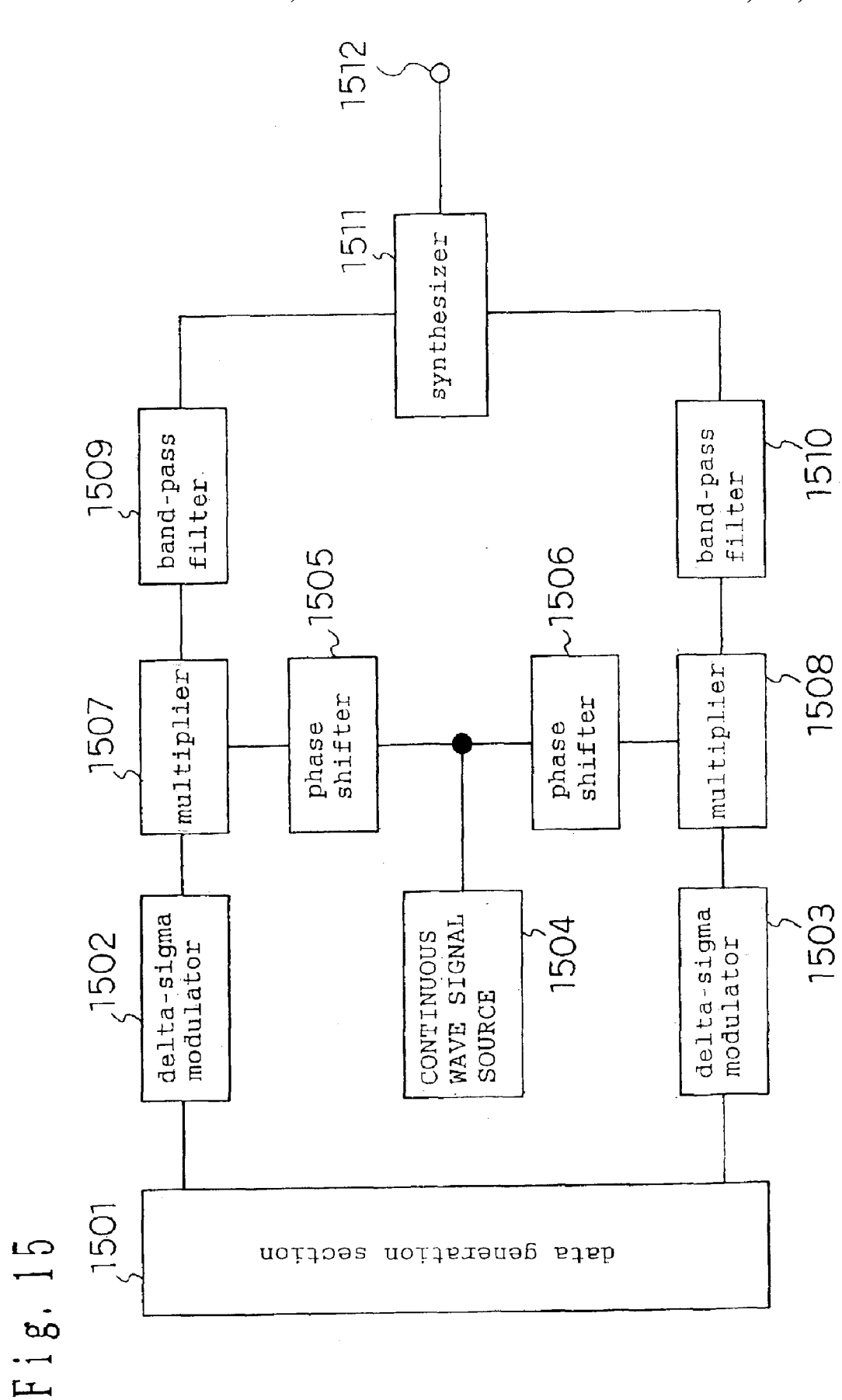
FIG. 15 is a block diagram illustrating Embodiment 4 of the invention.

Embodiment 4 of the invention will be described with reference to FIG. 15. Referring to FIG. 15, a data generation section 1501 generates two quadrature data I and Q, and outputs the data from two respective output terminals. The signals are delta-sigma modulated by delta-sigma modulators 1502 and 1503, and then supplied to one input of a multiplier 1507 and that of a multiplier 1508, respectively. Part of a signal which is generated by a continuous wave signal source 1504 is connected to the other input of the multiplier 1507 via a phase shifter 1505, and the remaining part of the signal which is generated by the continuous wave signal source 1504 is supplied to the other input of the multiplier 1508 via a phase shifter 1506. The difference between the phase rotation amounts of the phase shifters 1505 and 1506 is set to 90 degrees. Outputs of the multipliers 1507 and 1508 are subjected to elimination of quantization noise by band-pass filters 1509 and 1510, and then combined with each other by a combiner 1511 to be output from an output terminal 1512.

In this configuration, the level of the output power from the output terminal 1512 may be controlled by either of a method in which the input powers of the delta-sigma modulators 1502 and 1503 are controlled, and that in which the output power of the continuous wave signal source 1504 is controlled. In the case where the input powers of the delta-sigma modulators 1502 and 1503 are controlled, when the required output power from the output terminal 1512 is small, the noise level of the output signals of the delta-sigma modulators 1502 and 1503 are high in the same manner as Embodiments 1 and 2, so that the distortion characteristics and efficiency of the transmission circuit are impaired. When the output power from the output terminal 1512 is small, therefore, the characteristics can be prevented from being impaired, by lowering the output voltages of the delta-sigma modulators 1502 and 1503 as described in Embodiment 1. By contrast, in the case where the output power of the continuous wave signal source 1504 is controlled, it is not necessary to lower the output voltages of the delta-sigma modulators.

In the case where an amplifier is connected to the outputs of the multipliers 1507 and 1508, when the output voltages of the delta-sigma modulators 1502 and 1503 are lowered, or when the output power of the continuous wave signal source 1504 is reduced, characteristics of high efficiency can be maintained by lowering the power source voltage which is applied to a collector or drain of the amplifier.

(Embodiment 5)

Embodiment 5 of the invention will be described with reference to FIG. 4. A data generation section 401 generates amplitude data, phase data, and two quadrature data. Namely, $(I^2+Q^2)^{1/2}$ is output from a first output terminal, $\theta(t)$ (the definition of which is identical with that in Embodiment 2) is output from a second output terminal, and I and Q are output from a third output terminal. The signal output from the first output terminal is delta-sigma modulated by a delta-sigma modulator 402, and then supplied to one input of a switch 409 which is an example of the first switch in the invention. A DC power source 407 is connected to the other input of the switch 409. The switch 409 selects one of the output of the delta-sigma modulator 402, and the DC power source 407 as an input signal, and the selected signal is supplied to one input of a multiplier 404. The phase data which is output from the second output terminal of the data generation section 401 is angle modulated by an angle modulator 403, and then supplied to one input of a switch 410 which is an example of the second switch in the invention. The two quadrature data I and Q which are generated by the data generation section 401 are output from the third output terminal of the data generation section 401, and supplied to a vector modulation section 408 to be vector modulated. An output signal from the vector modulation section 408 is supplied to the other input of the switch 410. The switch 410 selects one of the signals, and the selected signal is supplied to the other input of the multiplier 404. When the switch 409 selects the delta-sigma modulator 402, an output signal of the multiplier 404 contains quantization noise. Therefore, quantization noise is eliminated by a band-pass filter 405, thereby obtaining a desired signal.

Next, the operation will be described. When a desired output power from an output terminal 406 is larger than a predetermined value, the switch 409 turns on the output of the delta-sigma modulator 402, and turns off that of the DC power source 407. The switch 410 turns on the output of the angle modulator 403, and turns off that of the vector modulation section 408. In this case, the embodiment operates in the same manner as Embodiment 2 described above. By contrast, when the desired output power from the output terminal 406 is smaller than the predetermined value, the switch 409 turns off the output of the delta-sigma modulator 402, and turns on that of the DC power source 407. The output of the angle modulator 403 is turned off, and that of the vector modulation section 408 is turned on. At this time, the vector modulated signal is amplified, and then output from the output terminal 406. When the required output power from the output terminal 406 is large, the power supply to the vector modulation section 408 is turned off, and, when the required output power from the output terminal 406 is small, the delta-sigma modulator 402 is turned off, so that the power consumption can be further reduced.

Next, methods of detecting the required output power from the output terminal 406 will be described. In a first method, the required output power is detected from amplitude information output from the first output terminal of the data generation section 401. In a second method, part of the output signal of the delta-sigma modulator 402 is connected to a low-pass filter, and the required output power is detected from the DC component of the output signal.

Figure 4:
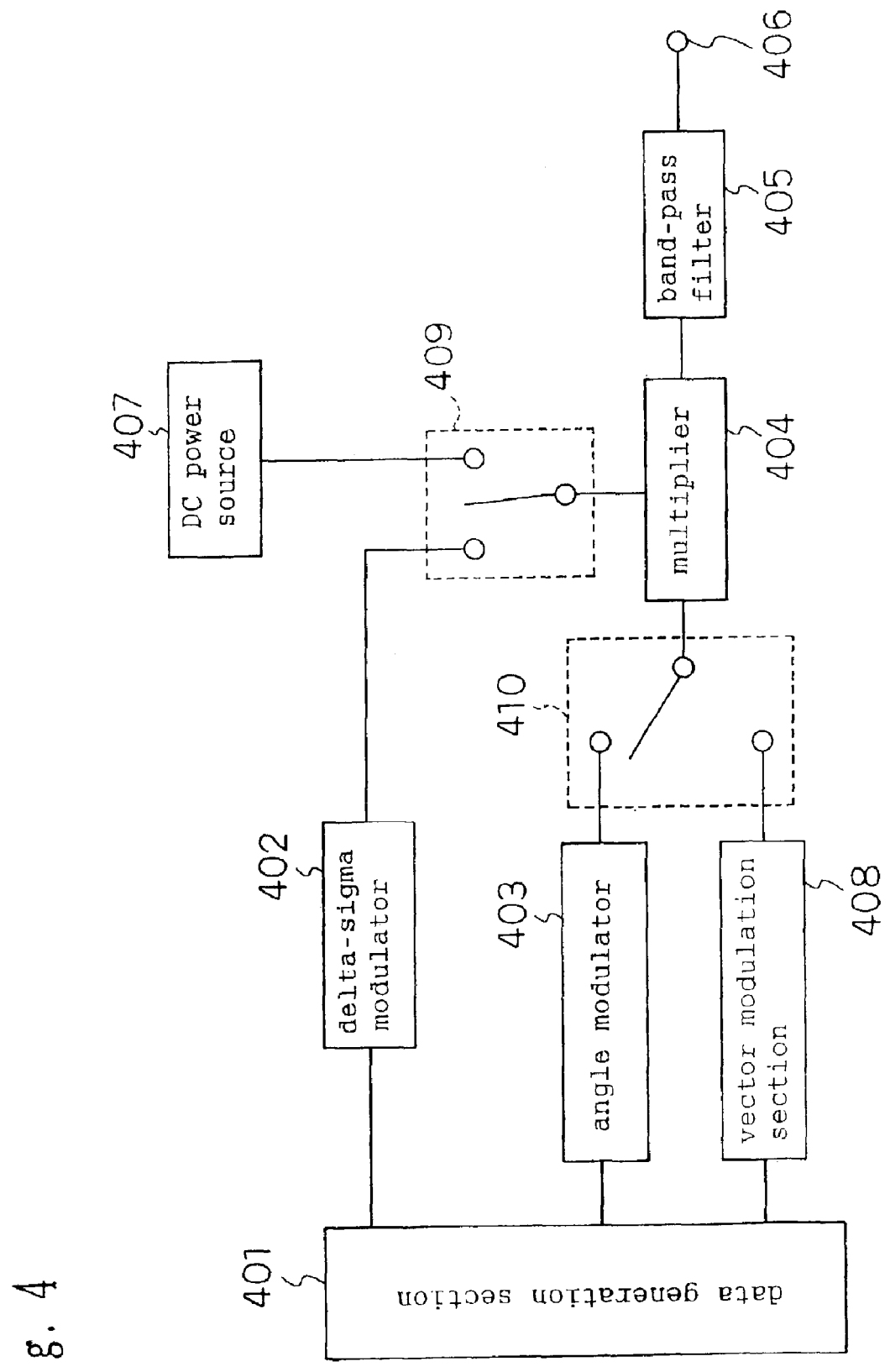
FIG. 4 is a block diagram illustrating Embodiment 5 of the invention.
Figure 21:
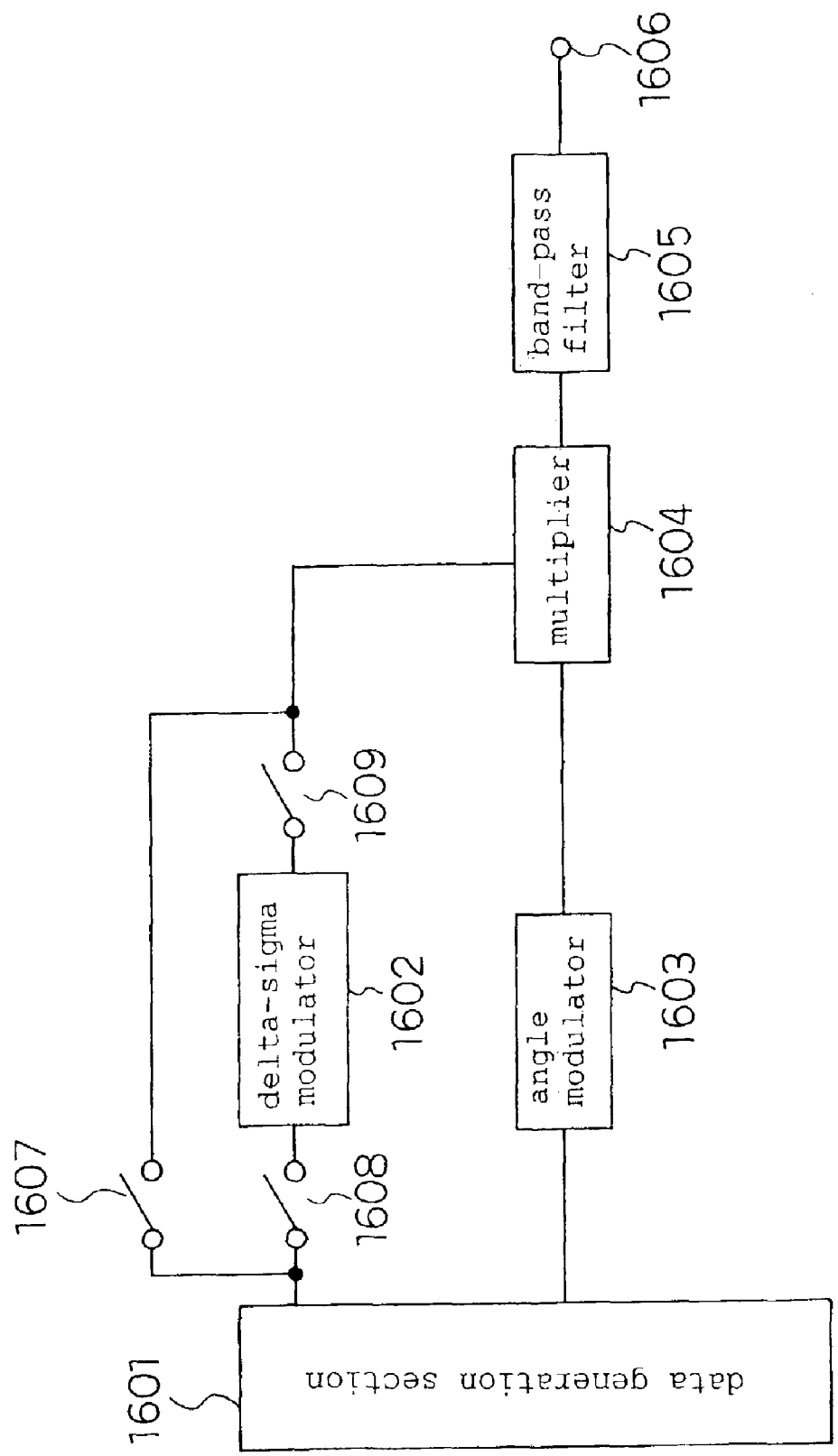
FIG. 21 is another block diagram illustrating Embodiment 5 of the invention.

FIG. 21 shows a variation of the circuit showed in FIG. 4. This variation is intended to be switched in accordance with the modulation system. More specifically, when a peak factor is large, a signal is processed via a delta-sigma modulator 1602 and when the peak factor is small, switches 1607–1609 operate so that a signal bypasses the delta-sigma modulator 1602. According to this configuration, the linearity of a multiplier 1604 is kept at a wider dynamic range since the signal is delta-sigma modulated by the delta-sigma modulator 1602 when the peak factor is large. When the peak factor is small, since the signal bypasses the delta-sigma modulator 1602, the power consumption is expected to be reduced.

(Embodiment 6)

Figure 5:
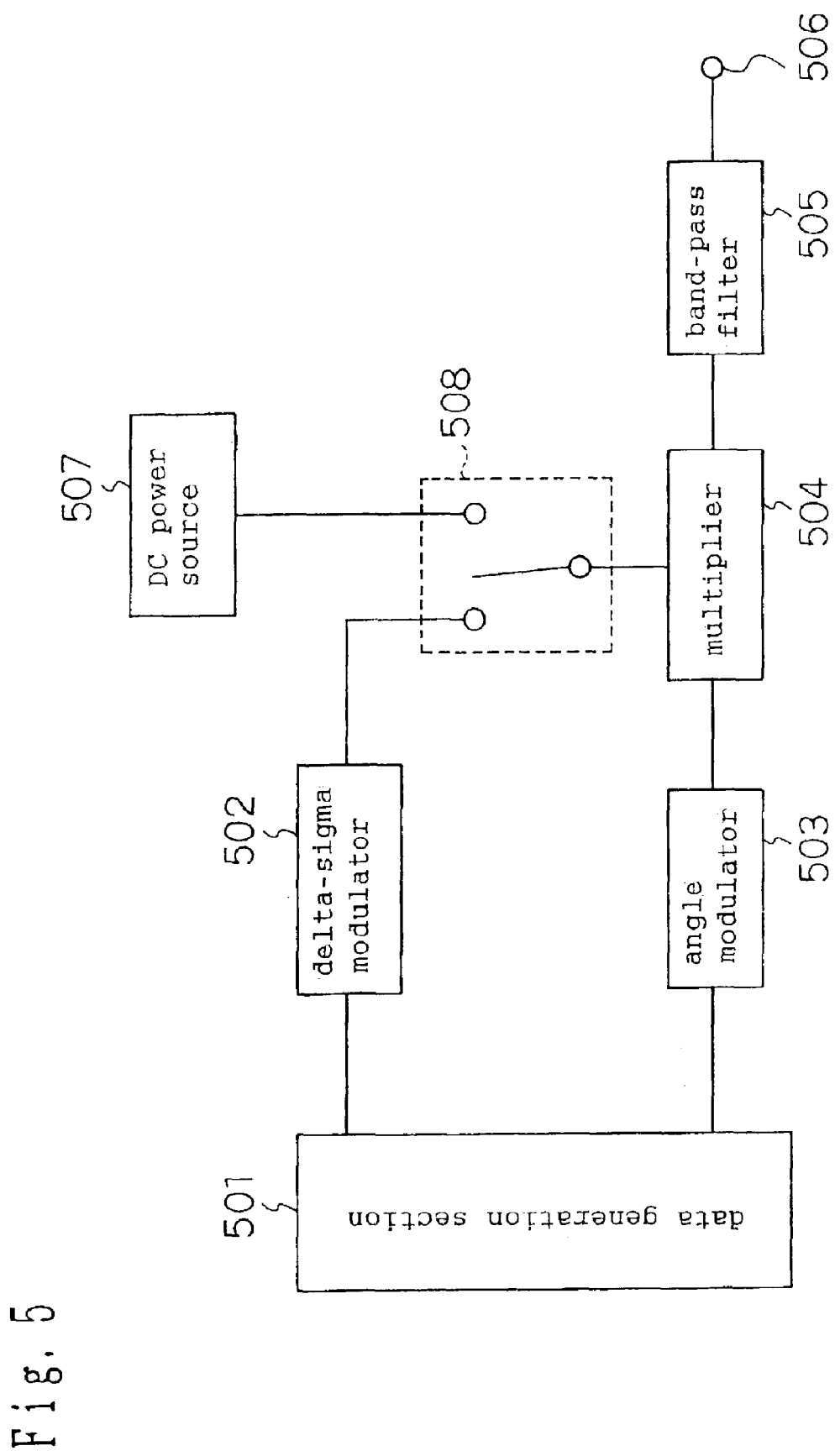
FIG. 5 is a block diagram illustrating Embodiment 6 of the invention.

Embodiment 6 of the invention will be described with reference to FIG. 5. Referring to FIG. 5, a data generation section 501 generates amplitude data and phase data. The amplitude data is supplied to a delta-sigma modulator 502 to be delta-sigma modulated. An output of the delta-sigma modulator 502 is connected to one input of a switch 508, and a DC power source 507 is connected to the other input of the switch 508. The phase data generated by the data generation section is supplied to an angle modulator 503 to be angle modulated, and then supplied to one input of a multiplier 504. An output of the switch 508 is connected to the other input of the multiplier 504. An output of the multiplier 504 is supplied to a band-pass filter 505, and then output from an output terminal 506.

Next, the operation will be described. When a signal which has been subjected to a modulation system or the linear modulation (for example, HPSK or OFDM) is to be transmitted, the switch 508 turns on the output of the delta-sigma modulator 502 to supply the output to the multiplier 504, and interrupts the output of the DC power source 507. When a signal which has been subjected to another modulation system or the nonlinear modulation (for example, GMSK) is to be transmitted, the output of the amplitude data from the data generation section 501 is stopped, and also the operation of the delta-sigma modulator is stopped. The switch 508 interrupts the output of the delta-sigma modulator 502, and supplies the output of the DC power source 507 to the multiplier 504. When the linear modulation is selected as the modulation system of the transmission signal, the transmission device of the embodiment operates in the same manner as that of Embodiment 2, and, when the nonlinear modulation is selected as the modulation system of the transmission signal, a signal which is obtained by amplifying an angle modulated signal is output from the output terminal 506. As a result of the operations, a high-efficiency operation can be realized in each of the modulation systems.

(Embodiment 7)

Figure 6:
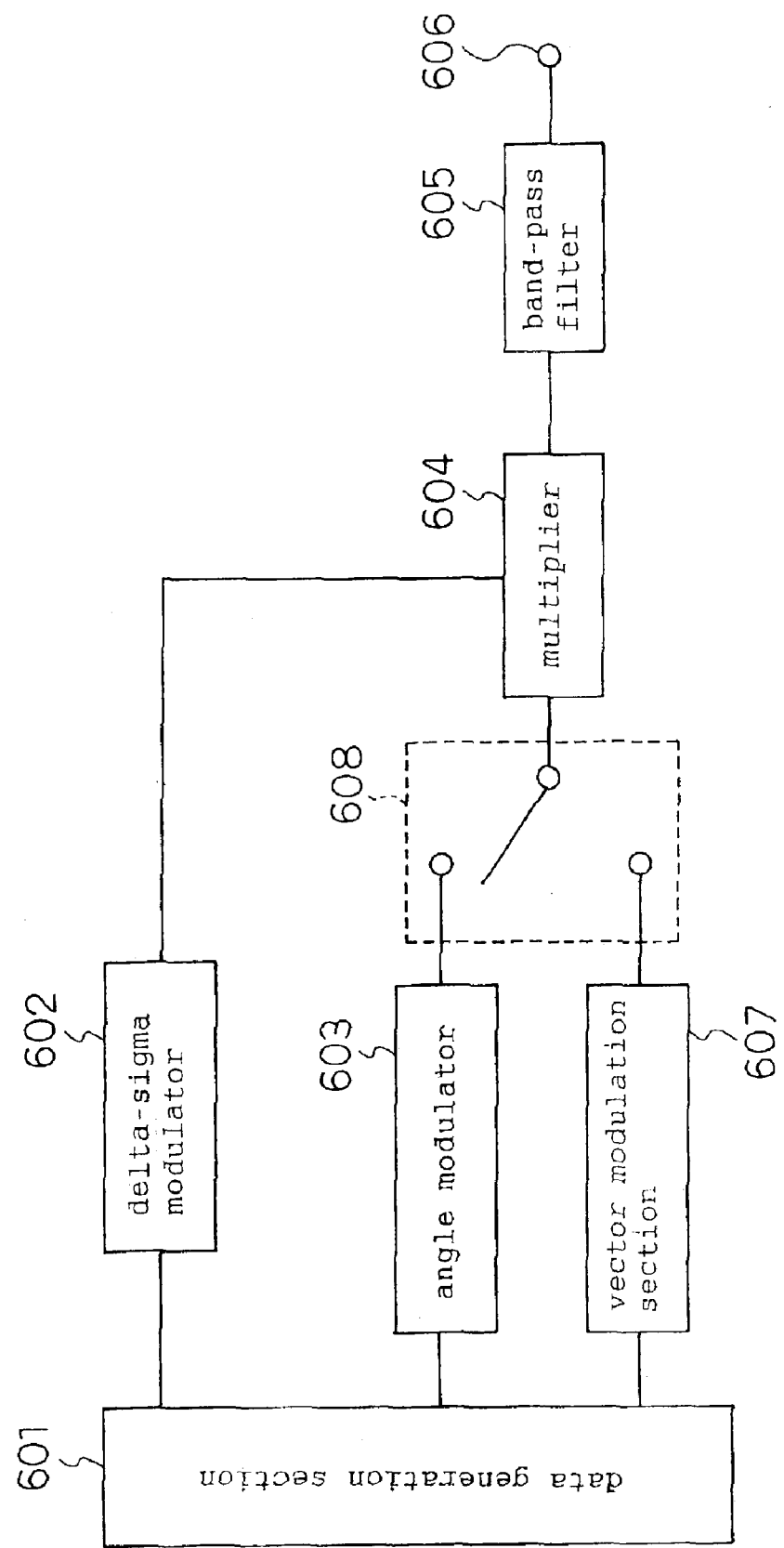
FIG. 6 is a block diagram illustrating Embodiment 7 of the invention.

Embodiment 7 of the invention will be described with reference to FIG. 6. A data generation section 601 generates amplitude data, phase data, and two quadrature data. The amplitude data is supplied to a delta-sigma modulator 602 to be delta-sigma modulated, and then supplied to one input of a multiplier 604. The phase data which is output from the data generation section is angle modulated by an angle modulator 603, and then supplied to one input of a switch 608. The two quadrature data are supplied to a vector modulation section 607 to be vector modulated, and then supplied to the other input of the switch 608. An output of the switch 608 is supplied to the other input of the multiplier 604. An output of the multiplier 604 is supplied to a band-pass filter 605 and then output from an output terminal 606.

Next, the operation will be described. When a required output power from the output terminal 606 is larger than a predetermined value, the switch 608 turns on one of the inputs, i.e., the connection with the angle modulator 603, and turns off the connection with the vector modulation section 607. At the same time, the operation of the vector modulation section 607 is stopped. In this case, the transmission device of the embodiment shown in FIG. 6 operates in the same manner as the transmission device of Embodiment 2. By contrast, when the required output power from the output terminal 606 is smaller than the predetermined value, the switch 608 turns off the other input, or the connection with the angle modulator 603, and turns on the connection with the vector modulation section 607. At this time, the operation of the angle modulator 603 is stopped. The delta-sigma modulator 602 outputs a clock signal irrespective of the input signal. Namely, the transmission device shown in FIG. 6 outputs a signal which is obtained by amplifying a vector modulated signal by the clock signal of the delta-sigma modulator 602. In the transmission device shown in FIG. 6, the characteristics can be prevented from being impaired in a low output power.

Figure 7:
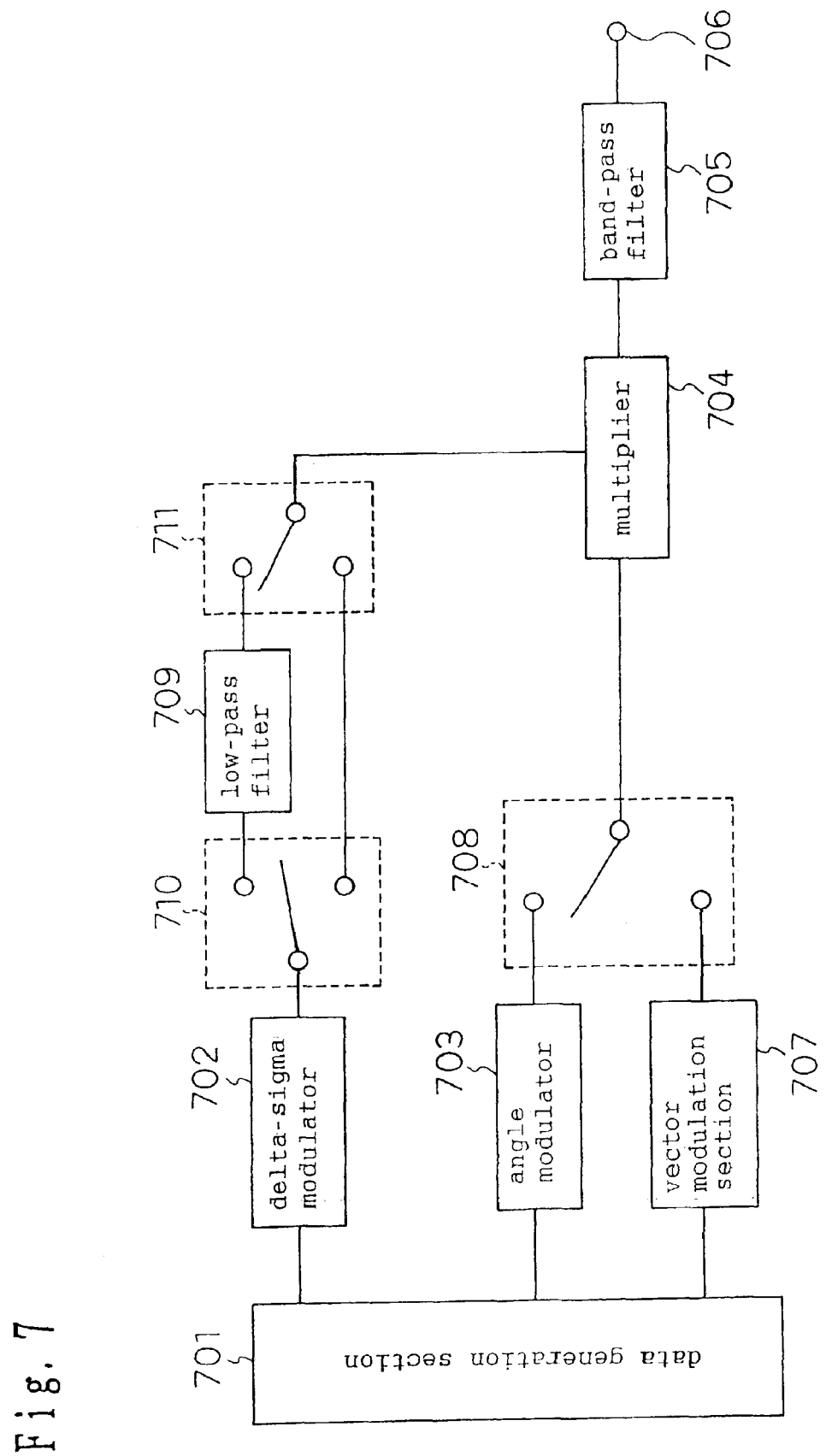
FIG. 7 is a block diagram illustrating Embodiment 7 of the invention.

In a transmission device shown in FIG. 7, in a high output power (i.e., when an output from an output terminal 706 is larger than a predetermined output power value), an output of a delta-sigma modulator 702 is directly supplied to a multiplier 704. In this case, the transmission device shown in FIG. 7 operates in the same manner as that of Embodiment 2. By contrast, in a low output power (i.e., when the output power from the output terminal 706 is smaller than the predetermined output power value), the output of the delta-sigma modulator 702 is supplied to the multiplier 704 via a low-pass filter 709, so that only a DC component is supplied to the multiplier 704. At this time, the transmission device shown in FIG. 7 outputs a signal which is obtained by amplifying a vector modulated signal.

According to the configurations and operations of the amplifier circuits and transmission devices of Embodiments 1 to 7, the characteristics in a low output power of the transmission devices can be improved and satisfactory characteristics can be maintained over a wide dynamic range.

The transmission devices of Embodiments 5 to 7 may be configured so that the output voltage of the delta-sigma modulator is controlled in accordance with the level of the transmission signal (transmission power).

Figure 8:
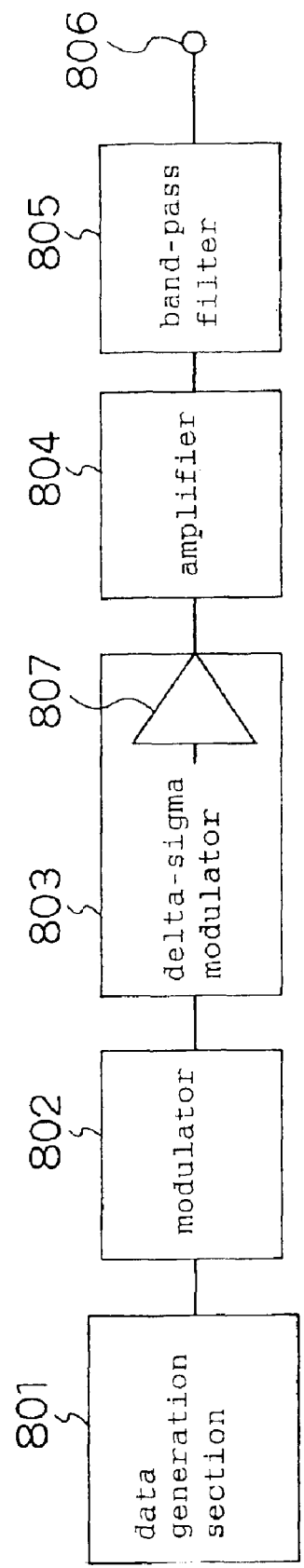
FIG. 8 is a block diagram illustrating Embodiment 1 of the invention.

In the above, the example in which the output stage of the internal circuit of the delta-sigma modulator 803 of FIG. 8 comprises the gain-variable amplifier circuit has been described. Also in a delta-sigma modulator of another type, a gain-variable amplifier circuit may be similarly disposed.

In the above description, the delta-sigma modulator may be a low-pass type, a band-pass type, or a high-pass type delta sigma modulator.

In the above description, for example, the converter in the invention corresponds to the delta-sigma modulator 102, 202, 302, 402, 502, 602, 702, 803, 1502, or 1503. However, the converter in the invention may be configured by a converter of another type as far as it converts a continuous signal to a discrete analog signal. An example of such a converter is a delta modulator. However, the converter in the invention is not restricted to this.

A discrete signal may be supplied to the converter in the invention. In this case, a converter in which the amplitude resolution of the output is lower than that of the input can attain the same effects as those described above.

In the above description, for example, the amplifier performs Class S operation. Alternatively, the amplifier may perform Class D, E, or F operation.

In the above description, vector modulation includes, for example, quadrature modulation, polar modulation, amplitude modulation and frequency modulation.

According to the invention, it is possible to provide an amplifier or a transmission device in which, even when the output power is reduced, the distortion or noise characteristics are not impaired.

What is claimed is:

1. An amplifier circuit comprising: a converter which converts an input signal to an analog signal in which an amplitude resolution of an output is lower than an amplitude resolution of an input; and
    an amplifier which is connected to an output of said converter,
    wherein an output stage inside said converter has first gain-variable amplifying means, and an output voltage of said converter being controlled in accordance with an output power of said amplifier by controlling a gain of said first gain-variable amplifying means.

2. An amplifier circuit comprising: a converter which converts a continuous signal to a discrete analog signal; and
    an amplifier which is connected to an output of said converter,
    wherein an output stage inside said converter has first gain-variable amplifying means, and an output voltage of said converter being controlled in accordance with an output power of said amplifier by controlling a gain of said first gain-variable amplifying means.

3. An amplifier circuit comprising: a converter which converts a continuous signal to a discrete analog signal; and
    an amplifier which is connected to an output of said converter,
    wherein said converter is a delta-sigma modulator which delta-sigma modulates a vector modulated signal, and an output stage inside said delta-sigma modulator has first gain-variable amplifying means, and an output voltage of said delta-sigma modulator being controlled in accordance with a modulation system of said modulated signal.

4. A transmission device wherein said transmission device comprises a delta-sigma modulator which delta-sigma modulates a signal,
    a signal containing said delta-sigma modulated signal is used as a transmission signal,
    an output stage inside said delta-sigma modulator has first gain-variable amplifying means, and
    an output voltage of said delta-sigma modulator is controlled in accordance with a level of said transmission signal by controlling a gain of said first gain-variable amplifying means.

5. A transmission device wherein said transmission device comprises a delta-sigma modulator which delta-sigma modulates a modulated signal,
    a signal containing said delta-sigma modulated signal is used as a transmission signal,
    an output stage inside said delta-sigma modulator has first gain-variable amplifying means, and
    an output voltage of said delta-sigma modulator is controlled in accordance with a modulation system by controlling a gain of said first gain-variable amplifying means.

6. An amplifier circuit according to claim 2, wherein said converter is a delta-sigma modulator, and said output voltage of said converter is a value defined as a maximum value in discrete voltages output from said converter.

7. An amplifier circuit according to claim 6 or 3 wherein second gain-variable amplifying means is connected between said delta-sigma modulator and said amplifier, and said output power is controlled by said second gain-variable amplifying means instead of being controlled by said output voltage of said delta-sigma modulator.

8. An amplifier circuit according to claim 6 or 3 wherein a power source voltage of said amplifier is controlled in accordance with said output power.

9. A transmission device wherein said transmission device comprises an amplifier circuit according to claim 6 or 3 and an output signal of said amplifier circuit is transmitted as a transmission signal.

10. A transmission device comprising:
    a data generation section which generates a signal;
    a vector modulator which modulates said signal output from said data generation section;
    an amplifier circuit according to claim 6 or 3 which amplifies a signal output from said vector modulator; and
    a band-pass filter which band-passes a signal output from said amplifier circuit.

11. A transmission device according to claim 4, wherein, when an output power of said transmission device is lowered, said output voltage of said delta-sigma modulator is controlled to be lowered.

12. A transmission device according to claim 4, or 5, wherein second gain-variable amplifying means is connected to an output of said delta-sigma modulator, and the level of said transmission signal is controlled by controlling a gain of said second gain-variable amplifying means.

13. A transmission device according to claim 5, wherein an amplitude component of a signal is delta-sigma modulated,
    a phase component of said signal is angle modulated, and
    a signal which is obtained by multiplying said delta-sigma modulated signal with said angle modulated signal is used as said transmission signal.

14. transmission device according to claim 13, wherein said transmission device comprises:
    a data generation section which outputs an amplitude signal and a phase signal;
    a delta-sigma modulator in which an input is connected to an amplitude signal output of said data generation section, and which delta-sigma modulates an input signal;
    an angle modulator in which an input is connected to a phase signal output of said data generation section, and which angle modulates an input signal;
    a multiplier in which an input is connected to an output of said delta-sigma modulator and an output of said angle modulator, and which multiplies input signals with each other; and
    a band-pass filter which is connected to an output of said multiplier, and which band-passes an input signal.

15. A transmission device wherein said transmission device comprises a delta-sigma modulator which delta-sigma modulates a signal, when a level of a transmission signal is larger than a predetermined value, an amplitude component of a signal is delta-sigma modulated, and a phase component of said signal is angle modulated, a signal which is obtained by multiplying said delta-sigma modulated signal with said angle modulated signal is used as a transmission signal, and when a level of said transmission signal is smaller than said predetermined value, a signal is vector modulated, and said vector modulated signal is amplified to be used as said transmission signal.

16. A transmission device according to claim 15, wherein said transmission device comprises:

a data generation section which outputs an amplitude signal, a phase signal, and a quadrature signal;

a delta-sigma modulator in which an input is connected to an amplitude signal output of said data generation section, and which delta-sigma modulates an input signal;

an angle modulator in which an input is connected to a phase signal output of said data generation section, and which angle modulates an input signal;

a vector modulation section in which an input is connected to a quadrature signal output of said data generation section, and which vector modulates an input signal;

a DC power source which supplies a DC component;

a first switch in which an output of said delta-sigma modulator and an output of said DC power source are respectively connected to inputs to be selected, and which selectively outputs one of an output signal of said delta-sigma modulator and an output signal of said DC power source;

a second switch in which an output of said angle modulator and an output of said vector modulation section are respectively connected to inputs to be selected, and which selectively outputs one of an output signal of said angle modulator and an output signal of said vector modulation section;

a multiplier in which an input is connected to an output of said first switch and an output of said second switch, and which multiplies two input signals with each other, and which outputs a signal of a result of the multiplication; and a band-pass filter which is connected to an output of said multiplier, and which band-passes said signal output from said multiplier, when a level of a transmission signal is larger than a predetermined value, said first switch selects said output of said delta-sigma modulator, and said second switch selects said output of said angle modulator, and when said level of said transmission signal is smaller than said predetermined value, said first switch selects said output of said DC power source, and said second switch selects said output of said vector modulation section.

17. A transmission device wherein said transmission device comprises a delta-sigma modulator which delta-sigma modulates a signal, when linear modulation is selected as a modulation system of a transmission signal, an amplitude component of a signal is delta-sigma modulated, and a phase component of said signal is angle modulated, a signal which is obtained by multiplying said delta-sigma modulated signal with said angle modulated signal is used as a transmission signal, and when nonlinear modulation is selected as the modulation system of said transmission signal, said angle modulated signal is amplified to be used as said transmission signal.

18. A transmission device according to claim 15, wherein said vector modulated signal is amplified by multiplication with a DC component which is a signal obtained by low-passing a signal output from said delta-sigma modulator.

19. A transmission device according to any one of claims 15 to 18, wherein an output voltage of said delta-sigma modulator is controlled in accordance with said level of said transmission signal.

* * * * *